(12) United States Patent
Boysel et al.

(10) Patent No.: US 11,674,803 B2
(45) Date of Patent: Jun. 13, 2023

(54) MULTI-MASS MEMS MOTION SENSOR

(71) Applicant: Motion Engine Inc., Montreal (CA)

(72) Inventors: Robert Mark Boysel, Montreal (CA); Louis Ross, Montreal (CA)

(73) Assignee: Motion Engine, Inc., Tokyo (JP)

( * ) Notice: Subject to any disclaimer, the term of this patent is extended or adjusted under 35 U.S.C. 154(b) by 340 days.

(21) Appl. No.: 15/315,894

(22) PCT Filed: Jan. 12, 2015

(86) PCT No.: PCT/CA2015/050018
§ 371 (c)(1),
(2) Date: Dec. 2, 2016

(87) PCT Pub. No.: WO2015/184531
PCT Pub. Date: Dec. 10, 2015

(65) Prior Publication Data
US 2017/0108336 A1    Apr. 20, 2017

Related U.S. Application Data

(60) Provisional application No. 62/006,469, filed on Jun. 2, 2014.

(51) Int. Cl.
*G01C 19/5712* (2012.01)
*G01P 15/18* (2013.01)
(Continued)

(52) U.S. Cl.
CPC ..... *G01C 19/5712* (2013.01); *G01C 19/5719* (2013.01); *G01C 19/5733* (2013.01);
(Continued)

(58) Field of Classification Search
CPC ..... G01P 2015/0845; G01P 2015/0848; G01C 19/5755; G01C 19/574
See application file for complete search history.

(56) References Cited

U.S. PATENT DOCUMENTS 4,430,895 A    2/1984  Colton
4,483,194 A    11/1984 Rudolf
(Continued)

FOREIGN PATENT DOCUMENTS

CN    103350983 A    10/2013
EP    1802952 A1    7/2007
(Continued)

OTHER PUBLICATIONS

Boysel, A Single-Proof-Mass MEMS Multi-Axis Motion Sensor. Semicon Japan. 6 pages. (2008).
(Continued)

*Primary Examiner* — Alexander A Mercado
(74) *Attorney, Agent, or Firm* — McCarter & English, LLP

(57) ABSTRACT

A micro-electro-mechanical system (MEMS) motion sensor is provided that includes a MEMS wafer having a frame structure, a plurality of proof masses suspended to the frame structure, movable in three dimensions, and enclosed in one or more cavities. The MEMS sensor includes top and bottom cap wafers bonded to the MEMS wafer and top and bottom electrodes provided in the top and bottom cap wafers, forming capacitors with the plurality of proof masses, and being together configured to detect motions of the plurality of proof masses. The MEMS sensor further includes first electrical contacts provided on the top cap wafer and electrically connected to the top electrodes, and a second electrical contacts provided on the top cap wafer and electrically connected to the bottom electrodes by way of vertically extending insulated conducting pathways. A method for measuring acceleration and angular rate along three mutually orthogonal axes is also provided.

24 Claims, 21 Drawing Sheets

(51) Int. Cl.
*G01C 19/5719* (2012.01)
*G01P 15/08* (2006.01)
*G01P 15/125* (2006.01)
*G01C 19/5733* (2012.01)

(52) U.S. Cl.
CPC ........ *G01P 15/0802* (2013.01); *G01P 15/125* (2013.01); *G01P 15/18* (2013.01); *B81B 2201/0235* (2013.01); *G01P 2015/084* (2013.01)

(56) References Cited

U.S. PATENT DOCUMENTS

| | | | |
|---|---|---|---|
| 4,553,436 A | 11/1985 | Hansson | |
| 4,590,801 A * | 5/1986 | Merhav | G01C 19/574 73/504.04 |
| 4,592,233 A * | 6/1986 | Peters | G01C 19/574 73/504.04 |
| 4,805,456 A | 2/1989 | Howe et al. | |
| 4,833,417 A | 5/1989 | Schroeder | |
| 4,881,408 A | 11/1989 | Hulsing, II et al. | |
| 4,882,933 A | 11/1989 | Petersen et al. | |
| 4,905,523 A | 3/1990 | Okada | |
| 4,967,605 A | 11/1990 | Okada | |
| 5,177,661 A | 1/1993 | Zavracky et al. | |
| 5,235,457 A | 8/1993 | Lichtman et al. | |
| 5,239,984 A | 8/1993 | Cane et al. | |
| 5,359,893 A | 11/1994 | Dunn | |
| 5,557,046 A | 9/1996 | Hulsing, II | |
| 5,596,144 A | 1/1997 | Swanson | |
| 5,608,210 A | 3/1997 | Esparza et al. | |
| 5,614,742 A | 3/1997 | Gessner et al. | |
| 5,623,270 A | 4/1997 | Kempkes et al. | |
| 5,635,639 A * | 6/1997 | Greiff | G01C 19/5719 73/504.04 |
| 5,646,346 A | 7/1997 | Okada | |
| 5,662,111 A | 9/1997 | Cosman | |
| 5,777,226 A * | 7/1998 | Ip | G01P 15/02 73/514.24 |
| 5,831,163 A | 11/1998 | Okada | |
| 5,894,090 A | 4/1999 | Tang et al. | |
| 5,895,850 A | 4/1999 | Buestgens | |
| 5,898,223 A | 4/1999 | Frye et al. | |
| 5,920,011 A | 7/1999 | Hulsing, II | |
| 5,959,206 A | 9/1999 | Ryrko et al. | |
| 5,962,784 A | 10/1999 | Hulsing, II | |
| 5,977,640 A | 11/1999 | Bertin et al. | |
| 5,987,985 A * | 11/1999 | Okada | G01C 19/56 73/504.04 |
| 5,992,233 A | 11/1999 | Clark | |
| 6,003,371 A | 12/1999 | Okada | |
| 6,028,773 A | 2/2000 | Hundt | |
| 6,053,057 A | 4/2000 | Okada | |
| 6,058,778 A | 5/2000 | Chan et al. | |
| 6,079,272 A | 6/2000 | Stell et al. | |
| 6,090,638 A | 7/2000 | Vigna et al. | |
| 6,091,132 A | 7/2000 | Bryant | |
| 6,119,517 A | 9/2000 | Breng et al. | |
| 6,122,961 A | 9/2000 | Geen et al. | |
| 6,159,773 A | 12/2000 | Lin | |
| 6,184,052 B1 | 2/2001 | Vigna et al. | |
| 6,225,699 B1 | 5/2001 | Ference et al. | |
| 6,235,550 B1 | 5/2001 | Chan et al. | |
| 6,257,057 B1 | 7/2001 | Hulsing, II | |
| 6,282,956 B1 | 9/2001 | Okada | |
| 6,295,870 B1 | 10/2001 | Hulsing, II | |
| 6,391,673 B1 | 5/2002 | Ha et al. | |
| 6,399,997 B1 | 6/2002 | Lin et al. | |
| 6,469,330 B1 | 10/2002 | Vigna et al. | |
| 6,487,000 B2 | 11/2002 | Mastromatteo et al. | |
| 6,490,923 B1 | 12/2002 | Breng et al. | |
| 6,508,124 B1 | 1/2003 | Zerbini et al. | |
| 6,539,801 B1 | 4/2003 | Gutierrez et al. | |
| 6,584,845 B1 | 7/2003 | Gutierrez et al. | |
| 6,587,312 B2 | 7/2003 | Murari et al. | |
| 6,621,137 B1 | 9/2003 | Ma et al. | |
| 6,651,500 B2 | 11/2003 | Stewart et al. | |
| 6,675,630 B2 | 1/2004 | Challoner et al. | |
| 6,696,364 B2 | 2/2004 | Gelmi et al. | |
| 6,701,786 B2 | 3/2004 | Hulsing, II | |
| 6,705,167 B2 | 3/2004 | Kvisteroey et al. | |
| 6,715,353 B2 | 4/2004 | Johnson | |
| 6,718,823 B2 | 4/2004 | Platt | |
| 6,766,689 B2 | 7/2004 | Spinola Durante et al. | |
| 6,772,632 B2 | 8/2004 | Okada | |
| 6,808,952 B1 | 10/2004 | Sniegowski et al. | |
| 6,808,955 B2 | 10/2004 | Ma | |
| 6,829,937 B2 | 12/2004 | Mahon | |
| 6,841,861 B2 | 1/2005 | Brady | |
| 6,856,144 B2 | 2/2005 | Lasalandra et al. | |
| 6,863,832 B1 | 3/2005 | Wiemer et al. | |
| 6,865,943 B2 | 3/2005 | Okada | |
| 6,892,575 B2 | 5/2005 | Nasir et al. | |
| 6,925,875 B2 | 8/2005 | Silverbrook | |
| 6,939,473 B2 | 9/2005 | Nasir et al. | |
| 6,942,750 B2 | 9/2005 | Chou et al. | |
| 6,944,931 B2 | 9/2005 | Shcheglov et al. | |
| 6,953,985 B2 | 10/2005 | Lin et al. | |
| 6,978,673 B2 | 12/2005 | Johnson et al. | |
| 6,990,863 B2 | 1/2006 | Challoner et al. | |
| 6,991,957 B2 | 1/2006 | Eskridge | |
| 6,993,617 B2 | 1/2006 | Butcher et al. | |
| 7,017,410 B2 | 3/2006 | Challoner et al. | |
| 7,040,163 B2 | 5/2006 | Shcheglov et al. | |
| 7,043,985 B2 | 5/2006 | Ayazi et al. | |
| 7,056,757 B2 | 6/2006 | Ayazi et al. | |
| 7,093,486 B2 | 8/2006 | Challoner et al. | |
| 7,100,448 B2 | 9/2006 | Ikegami | |
| 7,104,129 B2 | 9/2006 | Nasir et al. | |
| 7,138,694 B2 | 11/2006 | Nunan et al. | |
| 7,159,441 B2 | 1/2007 | Challoner et al. | |
| 7,160,752 B2 | 1/2007 | Ouellet et al. | |
| 7,168,317 B2 | 1/2007 | Chen et al. | |
| 7,168,318 B2 | 1/2007 | Challoner et al. | |
| 7,176,556 B2 | 2/2007 | Okamoto et al. | |
| 7,180,019 B1 | 2/2007 | Chiou et al. | |
| 7,210,351 B2 | 5/2007 | Lo et al. | |
| 7,217,588 B2 | 5/2007 | Hartzell et al. | |
| 7,238,999 B2 | 7/2007 | LaFond et al. | |
| 7,247,246 B2 | 7/2007 | Nasiri et al. | |
| 7,250,112 B2 | 7/2007 | Nasiri et al. | |
| 7,250,353 B2 | 7/2007 | Nasiri et al. | |
| 7,258,008 B2 | 8/2007 | Durante et al. | |
| 7,258,011 B2 | 8/2007 | Nasiri et al. | |
| 7,258,012 B2 | 8/2007 | Xie | |
| 7,275,424 B2 | 10/2007 | Felton et al. | |
| 7,291,561 B2 | 11/2007 | Ma et al. | |
| 7,318,349 B2 | 1/2008 | Vaganov et al. | |
| 7,322,236 B2 | 1/2008 | Combi et al. | |
| 7,322,237 B2 | 1/2008 | Kutsuna | |
| 7,337,671 B2 | 3/2008 | Ayazi et al. | |
| 7,347,095 B2 | 3/2008 | Shcheglov et al. | |
| 7,360,423 B2 | 4/2008 | Ayazi et al. | |
| 7,402,905 B2 * | 7/2008 | Eskridge | B81C 1/00301 257/702 |
| 7,417,329 B2 | 8/2008 | Chuang et al. | |
| 7,442,570 B2 | 10/2008 | Nasiri et al. | |
| 7,458,263 B2 | 12/2008 | Nasiri et al. | |
| 7,484,410 B2 | 2/2009 | Tsuji et al. | |
| 7,491,567 B2 | 2/2009 | DCamp et al. | |
| 7,518,493 B2 | 4/2009 | Bryzek et al. | |
| 7,541,588 B2 | 6/2009 | Tabirian et al. | |
| 7,543,496 B2 | 6/2009 | Ayaz et al. | |
| 7,578,189 B1 | 8/2009 | Mehregany | |
| 7,615,406 B2 | 11/2009 | Higashi et al. | |
| 7,617,729 B2 | 11/2009 | Axelrod et al. | |
| 7,621,183 B2 | 11/2009 | Seeger et al. | |
| 7,624,494 B2 | 12/2009 | Challoner et al. | |
| 7,642,115 B2 | 1/2010 | Eriksen et al. | |
| 7,642,657 B2 | 1/2010 | Suilleabhain et al. | |
| 7,677,099 B2 * | 3/2010 | Nasiri | G01C 19/5719 73/504.04 |
| 7,684,101 B2 | 3/2010 | Border et al. | |

(56) References Cited

U.S. PATENT DOCUMENTS

| | | |
|---|---|---|
| 7,689,321 B2 | 3/2010 | Karlsson |
| 7,690,254 B2 | 4/2010 | Pilchowski et al. |
| 7,694,563 B2 | 4/2010 | Durante et al. |
| 7,748,272 B2 | 7/2010 | Kranz et al. |
| 7,755,367 B2 | 7/2010 | Schoen et al. |
| 7,767,483 B1 | 8/2010 | Waters |
| 7,784,344 B2 | 8/2010 | Pavelescu et al. |
| 7,786,572 B2 | 8/2010 | Chen |
| 7,790,608 B2 | 9/2010 | Lauxtermann et al. |
| 7,810,379 B2 | 10/2010 | DeNatale et al. |
| 7,851,898 B2 | 12/2010 | Nakamura et al. |
| 7,863,698 B2 | 1/2011 | Seeger et al. |
| 7,875,942 B2 | 1/2011 | Cortese et al. |
| 7,882,740 B2 | 2/2011 | Okada |
| 7,886,601 B2 | 2/2011 | Merassi et al. |
| 7,898,043 B2 | 3/2011 | Ziglioli et al. |
| 7,908,921 B2 | 3/2011 | Binda et al. |
| 7,928,632 B2 | 4/2011 | Yang et al. |
| 7,929,143 B2 | 4/2011 | Wilfinger et al. |
| 7,934,423 B2 | 5/2011 | Nasiri et al. |
| 7,964,428 B2 | 6/2011 | Breng et al. |
| 7,971,483 B2 | 7/2011 | Supino et al. |
| 7,982,291 B2 | 7/2011 | Kuisma |
| 7,982,558 B2 | 7/2011 | Sworowski et al. |
| 7,987,714 B2 | 8/2011 | DeNatale et al. |
| 8,042,394 B2 | 10/2011 | Coronato et al. |
| 8,047,075 B2 | 11/2011 | Nasiri et al. |
| 8,049,515 B2 | 11/2011 | Schoen et al. |
| 8,069,726 B2 | 12/2011 | Seeger et al. |
| 8,071,398 B1 | 12/2011 | Yang et al. |
| 8,077,372 B2 | 12/2011 | Border et al. |
| 8,080,869 B2 | 12/2011 | Okudo et al. |
| 8,084,332 B2 | 12/2011 | Nasiri et al. |
| 8,100,012 B2 | 1/2012 | Martin et al. |
| 8,124,895 B2 | 2/2012 | Merassi et al. |
| 8,134,214 B2 | 3/2012 | Baldo et al. |
| 8,151,640 B1 | 4/2012 | Kubena |
| 8,166,816 B2 | 5/2012 | Ayazi et al. |
| 8,176,782 B2 | 5/2012 | Furukubo et al. |
| 8,220,328 B2 | 7/2012 | Rudolf et al. |
| 8,227,285 B1 | 7/2012 | Yang et al. |
| 8,227,911 B1 | 7/2012 | Yang et al. |
| 8,230,740 B2 | 7/2012 | Katsuki et al. |
| 8,236,577 B1 | 8/2012 | Hsu et al. |
| 8,258,590 B2 | 9/2012 | Geiger et al. |
| 8,272,266 B2 | 9/2012 | Zhang et al. |
| 8,283,737 B2 | 10/2012 | Sugizaki |
| 8,289,092 B2 | 10/2012 | Pomarico et al. |
| 8,297,121 B2 | 10/2012 | Quer et al. |
| 8,314,483 B2 | 11/2012 | Lin et al. |
| 8,324,047 B1 | 12/2012 | Yang |
| 8,347,717 B2 | 1/2013 | Seeger et al. |
| 8,350,346 B1 | 1/2013 | Huang et al. |
| 8,365,595 B2 | 2/2013 | Geiger et al. |
| 8,368,153 B2 | 2/2013 | Huang et al. |
| 8,372,677 B2 | 2/2013 | Mehregany |
| 8,375,789 B2 | 2/2013 | Prandi et al. |
| 8,384,134 B2 | 2/2013 | Daneman et al. |
| 8,390,173 B2 | 3/2013 | Yoshihara et al. |
| 8,395,252 B1 | 3/2013 | Yang |
| 8,395,381 B2 | 3/2013 | Lo et al. |
| 8,402,666 B1 | 3/2013 | Hsu et al. |
| 8,405,170 B2 | 3/2013 | Kohl et al. |
| 8,407,905 B1 | 4/2013 | Hsu et al. |
| 8,413,506 B2 | 4/2013 | Coronato et al. |
| 8,421,082 B1 | 4/2013 | Yang |
| 8,426,961 B2 | 4/2013 | Shih et al. |
| 8,432,005 B2 | 4/2013 | Yang et al. |
| 8,433,084 B2 | 4/2013 | Conti et al. |
| 8,445,307 B2 | 5/2013 | Yeh et al. |
| 8,459,093 B2 | 6/2013 | Donadel et al. |
| 8,459,110 B2 | 6/2013 | Cazzaniga et al. |
| 8,461,935 B2 | 6/2013 | McCraith et al. |
| 8,481,365 B2 | 7/2013 | Verheijden et al. |
| 8,486,744 B2 | 7/2013 | Lin et al. |
| 8,487,444 B2 | 7/2013 | Law et al. |
| 8,490,461 B2 | 7/2013 | Sasaki et al. |
| 8,490,483 B2 | 7/2013 | Wrede et al. |
| 8,497,557 B2 | 7/2013 | Tanaka et al. |
| 8,508,039 B1 | 8/2013 | Nasiri et al. |
| 8,508,045 B2 | 8/2013 | Khan et al. |
| 8,513,747 B1 | 8/2013 | Huang et al. |
| 8,519,537 B2 | 8/2013 | Jeng et al. |
| 8,567,246 B2 | 10/2013 | Shaeffer et al. |
| 8,569,090 B2 | 10/2013 | Taheri |
| 8,587,077 B2 | 11/2013 | Chen |
| 8,593,036 B2 | 11/2013 | Boysel |
| 8,614,110 B1 * | 12/2013 | Waters ............... B81C 1/00142 257/E23.002 |
| 8,637,943 B1 | 1/2014 | Yang |
| 8,652,961 B1 | 2/2014 | Yang |
| 8,675,181 B2 | 3/2014 | Hall |
| 8,685,776 B2 | 4/2014 | LaFond et al. |
| 8,704,238 B2 | 4/2014 | Yang et al. |
| 8,748,206 B2 | 6/2014 | Horning |
| 8,759,926 B2 | 6/2014 | Fujii et al. |
| 8,810,030 B2 | 8/2014 | Geisberger |
| 8,826,514 B2 | 9/2014 | Papavasiliou et al. |
| 8,869,616 B1 | 10/2014 | Sridharamurthy et al. |
| 8,885,170 B2 | 11/2014 | Kilic et al. |
| 8,921,145 B2 | 12/2014 | Shu et al. |
| RE45,439 E | 3/2015 | Prandi et al. |
| 9,013,233 B2 | 4/2015 | Elmallah et al. |
| 9,046,541 B1 | 6/2015 | Kubena et al. |
| 9,061,891 B2 | 6/2015 | Supino et al. |
| 9,063,549 B1 | 6/2015 | Pennecot et al. |
| 9,085,455 B2 | 7/2015 | Cheng et al. |
| 9,309,106 B2 | 4/2016 | Boysel et al. |
| 9,340,414 B2 | 5/2016 | Yoneoka et al. |
| 9,409,768 B2 | 8/2016 | DeNatale et al. |
| 9,499,397 B2 | 11/2016 | Bowles et al. |
| 9,567,204 B2 | 2/2017 | Hung et al. |
| 9,594,128 B2 | 3/2017 | Farghaly et al. |
| 9,751,754 B2 | 9/2017 | Kurashima et al. |
| 9,784,835 B1 | 10/2017 | Droz et al. |
| 9,837,935 B2 | 12/2017 | Johnson et al. |
| 9,869,754 B1 | 1/2018 | Campbell et al. |
| 9,945,950 B2 | 4/2018 | Newman et al. |
| 9,981,841 B2 | 5/2018 | Chu et al. |
| 10,365,131 B2 | 7/2019 | Grossman et al. |
| 10,392,244 B2 | 8/2019 | Hung et al. |
| 10,407,299 B2 | 9/2019 | Boysel |
| 10,598,689 B2 | 3/2020 | Zwahlen et al. |
| 10,768,065 B2 | 9/2020 | Boysel et al. |
| 10,793,421 B2 | 10/2020 | Rajasekaran et al. |
| 2001/0011994 A1 | 8/2001 | Morimoto et al. |
| 2002/0040602 A1 | 4/2002 | Okada |
| 2003/0094046 A1 | 5/2003 | Okada |
| 2003/0209075 A1 | 11/2003 | Okada |
| 2004/0052016 A1 | 3/2004 | Takagi et al. |
| 2004/0063239 A1 | 4/2004 | Yun et al. |
| 2004/0211258 A1 | 10/2004 | Geen |
| 2004/0224279 A1 | 11/2004 | Siemons |
| 2004/0231422 A1 | 11/2004 | Okada |
| 2005/0076719 A1 | 4/2005 | Jakobsen et al. |
| 2005/0166677 A1 | 8/2005 | Nasiri et al. |
| 2005/0210981 A1 | 9/2005 | Okada |
| 2005/0242991 A1 | 11/2005 | Montgomery et al. |
| 2006/0163453 A1 | 7/2006 | Hynes et al. |
| 2006/0179941 A1 | 8/2006 | Okada |
| 2006/0180896 A1 | 8/2006 | Martin et al. |
| 2006/0185428 A1 | 8/2006 | Combi et al. |
| 2006/0231521 A1 | 10/2006 | Chilcott |
| 2007/0180912 A1 | 8/2007 | Judy et al. |
| 2007/0214886 A1 | 9/2007 | Sheynblat |
| 2007/0273018 A1 | 11/2007 | Onozuka et al. |
| 2007/0279885 A1 | 12/2007 | Basavanhally et al. |
| 2007/0297631 A1 | 12/2007 | Miles |
| 2008/0098814 A1 | 5/2008 | Platt et al. |
| 2008/0283990 A1 | 11/2008 | Nasiri et al. |
| 2008/0289417 A1 | 11/2008 | Okada |
| 2009/0114016 A1 | 5/2009 | Nasiri et al. |
| 2009/0199637 A1 | 8/2009 | Sugiura et al. |
| 2009/0255335 A1 | 10/2009 | Fly et al. |

(56) References Cited

U.S. PATENT DOCUMENTS

| | | |
|---|---|---|
| 2009/0297770 A1 | 12/2009 | Koshida et al. |
| 2010/0084752 A1 | 4/2010 | Horning et al. |
| 2010/0132460 A1 | 6/2010 | Seeger et al. |
| 2010/0164086 A1 | 7/2010 | Noma et al. |
| 2010/0176466 A1 | 7/2010 | Fujii et al. |
| 2010/0182418 A1 | 7/2010 | Jess et al. |
| 2010/0212425 A1* | 8/2010 | Hsu ............... G01P 15/0802 |
| | | 73/514.32 |
| 2010/0218977 A1 | 9/2010 | Inoue et al. |
| 2010/0259130 A1 | 10/2010 | Eckstein et al. |
| 2010/0324366 A1 | 12/2010 | Shimotsu |
| 2011/0012248 A1 | 1/2011 | Reichenbach et al. |
| 2011/0016972 A1 | 1/2011 | Reinert |
| 2011/0030473 A1 | 2/2011 | Acar |
| 2011/0219876 A1 | 9/2011 | Kalnitsky et al. |
| 2011/0227173 A1 | 9/2011 | Seppala et al. |
| 2011/0228906 A1 | 9/2011 | Jaffray et al. |
| 2012/0006789 A1 | 1/2012 | DeNatale et al. |
| 2012/0032286 A1* | 2/2012 | Trusov ............ B81B 7/0074 |
| | | 257/417 |
| 2012/0042731 A1 | 2/2012 | Lin et al. |
| 2012/0048017 A1 | 3/2012 | Kempe |
| 2012/0091854 A1 | 4/2012 | Kaajakari |
| 2012/0137774 A1 | 6/2012 | Judy et al. |
| 2012/0142144 A1* | 6/2012 | Taheri ............... B81B 7/007 |
| | | 438/107 |
| 2012/0227487 A1 | 9/2012 | Ayazi et al. |
| 2012/0261822 A1 | 10/2012 | Graham et al. |
| 2012/0272734 A1* | 11/2012 | Jeung ............. G01P 15/0802 |
| | | 73/514.01 |
| 2012/0280594 A1 | 11/2012 | Chen et al. |
| 2012/0291547 A1* | 11/2012 | Kim .............. G01C 19/5755 |
| | | 73/504.12 |
| 2012/0300050 A1 | 11/2012 | Korichi et al. |
| 2012/0326248 A1 | 12/2012 | Eman et al. |
| 2013/0019678 A1* | 1/2013 | Lazaroff ......... G01C 19/5762 |
| | | 29/832 |
| 2013/0019680 A1 | 1/2013 | Kittilsland et al. |
| 2013/0100271 A1 | 4/2013 | Howes |
| 2013/0105921 A1 | 5/2013 | Najafi et al. |
| 2013/0115729 A1 | 5/2013 | Silverbrook et al. |
| 2013/0119492 A1 | 5/2013 | Feiertag et al. |
| 2013/0126992 A1 | 5/2013 | Ehrenpfordt et al. |
| 2013/0146994 A1 | 6/2013 | Kittilsland et al. |
| 2013/0147020 A1 | 6/2013 | Gonska et al. |
| 2013/0168740 A1 | 7/2013 | Chen |
| 2013/0181355 A1 | 7/2013 | Tsai et al. |
| 2013/0192363 A1* | 8/2013 | Loreck ............. G01C 19/574 |
| | | 73/504.12 |
| 2013/0192369 A1 | 8/2013 | Acar et al. |
| 2013/0210175 A1 | 8/2013 | Hoisington et al. |
| 2013/0221454 A1 | 8/2013 | Dunbar, III et al. |
| 2013/0241546 A1 | 9/2013 | Fu |
| 2013/0253335 A1 | 9/2013 | Noto et al. |
| 2013/0270657 A1* | 10/2013 | Acar ............... G01C 19/5755 |
| | | 257/415 |
| 2013/0277773 A1 | 10/2013 | Bryzek et al. |
| 2013/0285165 A1 | 10/2013 | Classen et al. |
| 2013/0299924 A1 | 11/2013 | Weber et al. |
| 2013/0315036 A1 | 11/2013 | Paulson et al. |
| 2013/0341737 A1 | 12/2013 | Bryzek et al. |
| 2014/0007685 A1 | 1/2014 | Zhang et al. |
| 2014/0090469 A1* | 4/2014 | Comi ............... G01P 15/097 |
| | | 73/504.12 |
| 2014/0090485 A1 | 4/2014 | Feyh et al. |
| 2014/0091405 A1 | 4/2014 | Weber |
| 2014/0092460 A1 | 4/2014 | Schwedt et al. |
| 2014/0116135 A1 | 5/2014 | Cazzaniga et al. |
| 2014/0116136 A1 | 5/2014 | Coronato et al. |
| 2014/0124958 A1 | 5/2014 | Bowles et al. |
| 2014/0125325 A1 | 5/2014 | Ocak et al. |
| 2014/0125359 A1 | 5/2014 | El-Gamal et al. |
| 2014/0137648 A1 | 5/2014 | Zolfagharkhani et al. |
| 2014/0138853 A1 | 5/2014 | Liu et al. |
| 2014/0162393 A1 | 6/2014 | Yang |
| 2014/0166463 A1 | 6/2014 | Jahnes et al. |
| 2014/0183729 A1 | 7/2014 | Bowles |
| 2014/0186986 A1 | 7/2014 | Shu et al. |
| 2014/0193949 A1 | 7/2014 | Wu |
| 2014/0203421 A1 | 7/2014 | Shu et al. |
| 2014/0210019 A1 | 7/2014 | Nasiri et al. |
| 2014/0227816 A1 | 8/2014 | Zhang et al. |
| 2014/0230548 A1 | 8/2014 | Coronato et al. |
| 2014/0231936 A1 | 8/2014 | Jahnes et al. |
| 2014/0231938 A1 | 8/2014 | Campedelli et al. |
| 2014/0260612 A1* | 9/2014 | Aono ............. G01C 19/5705 |
| | | 73/504.12 |
| 2014/0260617 A1 | 9/2014 | Ocak et al. |
| 2014/0264650 A1 | 9/2014 | Liu et al. |
| 2014/0283605 A1 | 9/2014 | Baldasarre et al. |
| 2014/0287548 A1 | 9/2014 | Lin et al. |
| 2014/0291128 A1 | 10/2014 | Kwa |
| 2014/0311242 A1 | 10/2014 | Lee et al. |
| 2014/0311247 A1 | 10/2014 | Zhang et al. |
| 2014/0318906 A1 | 10/2014 | Deimerly et al. |
| 2014/0319630 A1 | 10/2014 | Conti et al. |
| 2014/0322854 A1 | 10/2014 | Nakatani et al. |
| 2014/0326070 A1 | 11/2014 | Neul et al. |
| 2014/0331769 A1 | 11/2014 | Fell |
| 2014/0339654 A1 | 11/2014 | Classen |
| 2014/0339656 A1 | 11/2014 | Schlarmann et al. |
| 2014/0349434 A1 | 11/2014 | Huang et al. |
| 2014/0352433 A1 | 12/2014 | Hammer |
| 2014/0353775 A1 | 12/2014 | Formosa et al. |
| 2014/0357007 A1 | 12/2014 | Cheng et al. |
| 2014/0370638 A1 | 12/2014 | Lee et al. |
| 2014/0374850 A1 | 12/2014 | Chen et al. |
| 2014/0374854 A1 | 12/2014 | Xue |
| 2014/0374917 A1 | 12/2014 | Weber et al. |
| 2014/0374918 A1 | 12/2014 | Weber et al. |
| 2015/0008545 A1 | 1/2015 | Quevy et al. |
| 2015/0115376 A1 | 4/2015 | Chen et al. |
| 2015/0191345 A1 | 7/2015 | Boysel et al. |
| 2015/0198493 A1 | 7/2015 | Kaelberer et al. |
| 2015/0260519 A1 | 9/2015 | Boysel et al. |
| 2015/0329351 A1 | 11/2015 | Cheng et al. |
| 2015/0330782 A1 | 11/2015 | Johnson et al. |
| 2015/0353346 A1 | 12/2015 | Heuck et al. |
| 2015/0371390 A1 | 12/2015 | Gassner et al. |
| 2016/0003923 A1 | 1/2016 | Zieren et al. |
| 2016/0060104 A1 | 3/2016 | Chu et al. |
| 2016/0229684 A1 | 8/2016 | Boysel |
| 2016/0229685 A1 | 8/2016 | Boysel |
| 2016/0289063 A1 | 10/2016 | Ocak et al. |
| 2016/0320426 A1 | 11/2016 | Boysel et al. |
| 2016/0327446 A1 | 11/2016 | Classen et al. |
| 2017/0030788 A1 | 2/2017 | Boysel et al. |
| 2017/0363694 A1 | 12/2017 | Boysel |
| 2018/0074090 A1* | 3/2018 | Boysel ........... G01C 19/5762 |
| 2018/0327255 A1 | 11/2018 | Endean et al. |
| 2019/0064364 A1 | 2/2019 | Boysel et al. |
| 2020/0346920 A1 | 11/2020 | Endean et al. |
| 2021/0156756 A1 | 5/2021 | Boysel et al. |
| 2021/0198096 A1 | 7/2021 | Borca-Tasciuc et al. |

FOREIGN PATENT DOCUMENTS

| | | |
|---|---|---|
| EP | 1819012 A2 | 8/2007 |
| EP | 2410344 A2 | 1/2012 |
| EP | 2544302 A1 | 1/2013 |
| EP | 2693182 A1 | 2/2014 |
| EP | 2693183 A1 | 2/2014 |
| EP | 3019442 A1 | 5/2016 |
| JP | 2008-114354 A | 5/2008 |
| JP | 2008-132587 A | 6/2008 |
| JP | 2009-245877 A | 10/2009 |
| JP | 2011-194478 A | 10/2011 |
| JP | 2012-247192 A | 12/2012 |
| JP | 2013-030759 A | 2/2013 |
| JP | 2013-164285 A | 8/2013 |
| WO | 2008086530 A2 | 7/2008 |
| WO | 2009057990 A2 | 5/2009 |
| WO | 2011/151098 A2 | 12/2011 |

(56) References Cited

FOREIGN PATENT DOCUMENTS

| | | |
|---|---|---|
| WO | 2013116356 A1 | 8/2013 |
| WO | 2014122910 A1 | 8/2014 |
| WO | 2014159957 A1 | 10/2014 |
| WO | 2014177542 A1 | 11/2014 |
| WO | 2014184025 A1 | 11/2014 |
| WO | 2015003264 A1 | 1/2015 |
| WO | 2015013827 A1 | 2/2015 |
| WO | 2015013828 A1 | 2/2015 |
| WO | 2015/038078 A1 | 3/2015 |
| WO | 2015042700 A1 | 4/2015 |
| WO | 2015042701 A1 | 4/2015 |
| WO | 2015042702 A1 | 4/2015 |
| WO | 2015103688 A1 | 7/2015 |
| WO | 2015154173 A1 | 10/2015 |

OTHER PUBLICATIONS

Boysel et al., Development of a Single-Mass Five-Axis MEMS Motion Sensor. Virtus Advanced Sensors, Inc., 17 pages. (May 2009).
Boysel, White Paper Series: Virtus Sensor Technology. Virtus Advanced Sensors. Semicon Japan, 11 pages. Nov. 11, 2008.
Watanabe et al., SOI micromachined 5-axis motion sensor using resonant electrostatic drive and non-resonant capacitive detection mode. Sensor and Actuators A. 2006;130-131:116-123.
European Search Report for Application No. 14822259.9 dated Jan. 4, 2017.
International Search Report and Written Opinion for International Patent Application No. PCT/CA2014/050729, dated Nov. 3, 2014.
International Search Report and Written Opinion for International Patent Application No. PCT/CA2014/050902, dated Dec. 15, 2014.
International Search Report and Written Opinion for International Patent Application No. PCT/CA2014/050904, dated Dec. 1, 2014.
International Search Report and Written Opinion for International Patent Application No. PCT/CA2014/050910, dated Dec. 22, 2014.
International Search Report and Written Opinion for International Patent Application No. PCT/CA2014/051245, dated Feb. 25, 2015.
International Search Report and Written Opinion for International Patent Application No. PCT/CA2015/050018, dated Apr. 20, 2015.
International Search Report and Written Opinion for International Patent Application No. PCT/CA2015/050026, dated Apr. 27, 2015.
Chan et al., A Monolithically Integrated Pressure/Oxygen/Temperature Sensing SoC for Multimodality Intracranial Neuromonitoring. IEEE Journal of Solid-State Circuits. Nov. 2014;49(11):2449-61.
Merdassi et al., Capacitive MEMS absolute pressure sensor using a modified commercial microfabrication process. Microsystem Technol. Aug. 2017;23(8):3215-25. Published Online Jun. 20, 2016.
Merdassi et al., Design and Fabrication of 3-Axis Accelerometer Sensor Microsystem for Wide Temperature Range Applications Using Semi-Custom Process. Proc of SPIE. Mar. 2014;8973:89730O-1-89730O-12.
Merdassi et al., Design of 3-axis Capacitive Low-Gravity MEMS Accelerometer with Zero Cross-Axis Sensitivity in a Commercial Process. NSTI-Nanotech, www.nsti.org. Jan. 2013;2:185-188.
Merdassi et al., Wafer level vacuum encapsulated tri-axial accelerometer with low cross-axis sensitivity in a commercial MEMS Process. Sensorsand Actuators A. Oct. 2015;236:25-37.
Merdassi, Ultra-Clean Wafer-Level Vacuum Encapsulated Intertial Using a Commercial Process. Department of Electrical and Computer Engineering McGill University, Montreal, Canada. A thesis submitted to McGill University in partial fulfillment of the Requirements of the degree of Doctor of Philosophy. 158 pages, Jul. 2016.
International Search Report and Written Opinion for Application No. PCT/CA2016/050303, dated Jun. 13, 2016. 7 pages.
International Search Report and Written Opinion for Application No. PCT/US2017/015393, dated Apr. 26, 2017. 17 pages.
International Search Report for Application No. PCT/CA2014/050730, dated Nov. 3, 2014. 3 pages.
International Search Report for Application No. PCT/CA2016/050031, dated Mar. 16, 2016. 3 pages.
Supplementary European Search Report for Application No. 14831791.0, dated Jun. 12, 2017, 8 pages.

* cited by examiner

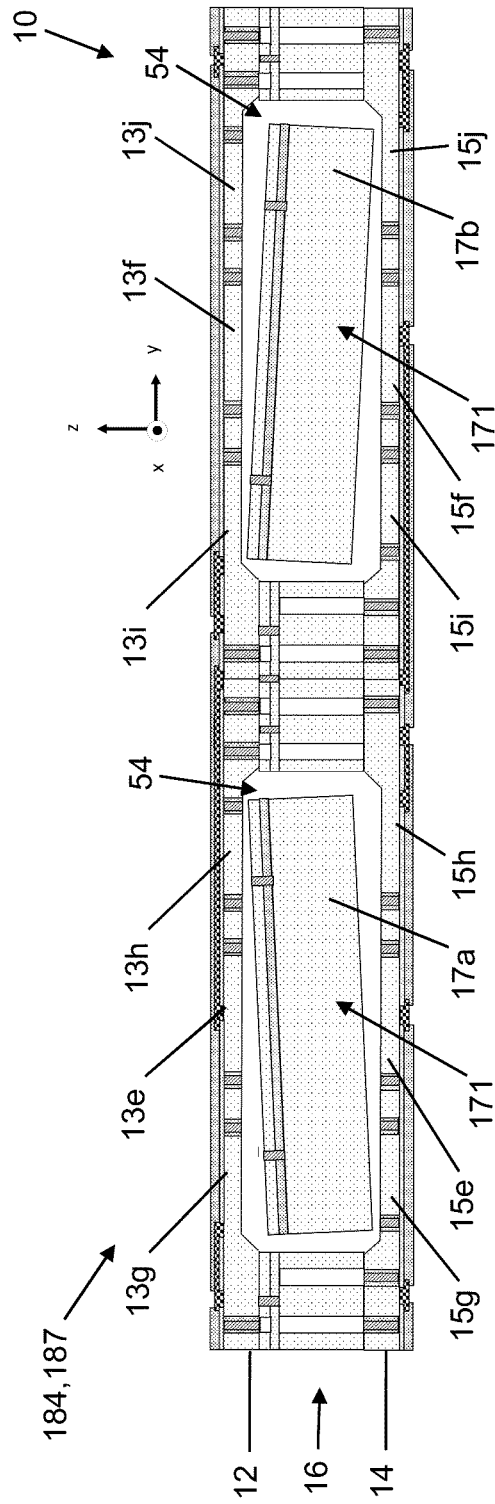
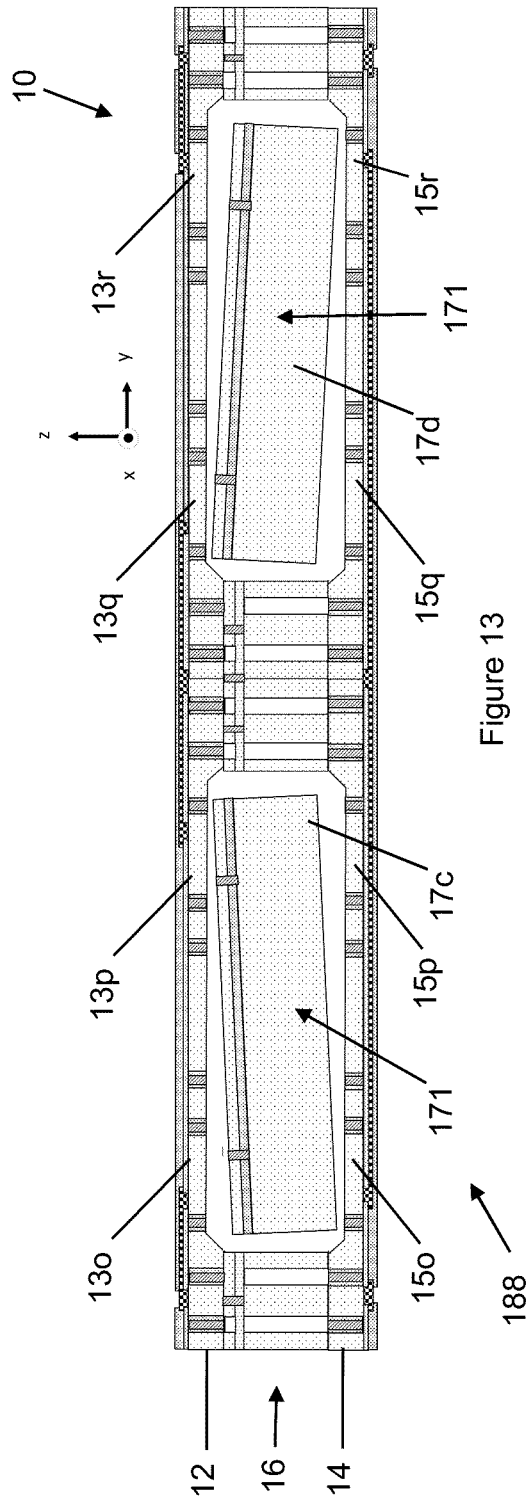
Figure 12
Figure 13

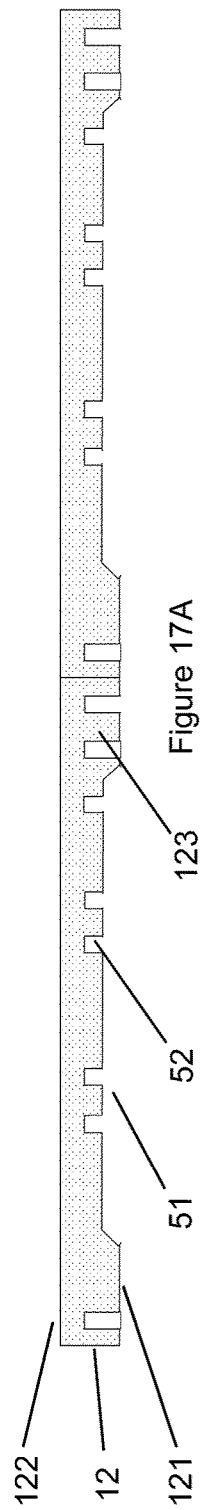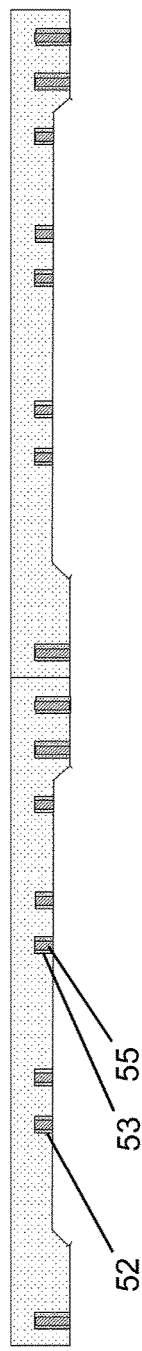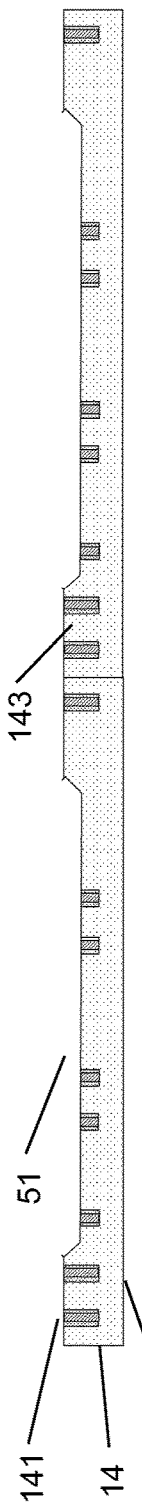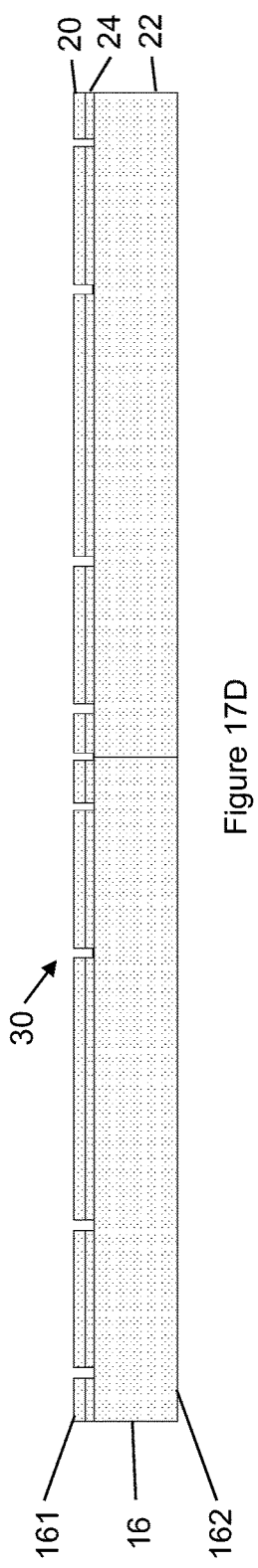

MULTI-MASS MEMS MOTION SENSOR

RELATED PATENT APPLICATIONS

This patent application is a 35 U.S.C. § 371 national stage filing of International Application No. PCT/CA2015/050018, filed Jan. 12, 2015, which in turn claims priority from U.S. Provisional Patent Application No. 62/006,469, filed Jun. 2, 2014, the above applications being incorporated herein, in their entirety, by reference.

TECHNICAL FIELD

The general technical field relates to micro-electro-mechanical systems (MEMS), and more particularly, to a multi-mass MEMS motion sensor, to a method of measuring linear acceleration and angular rate of rotation using such a MEMS motion sensor, and to a method of manufacturing such a MEMS motion sensor.

BACKGROUND

Micro-electro-mechanical systems (MEMS) are an increasingly important enabling technology. MEMS inertial sensors are used to sense changes in the state of motion of an object, including changes in position, velocity, acceleration or orientation, and encompass devices such as accelerometers, gyroscopes, vibrometers and inclinometers. Broadly described, MEMS devices are integrated circuits (ICs) containing tiny mechanical, optical, magnetic, electrical, chemical, biological, or other, transducers or actuators. MEMS devices can be manufactured using high-volume silicon wafer fabrication techniques developed over the past fifty years for the microelectronics industry. Their resulting small size and low cost make them attractive for use in an increasing number of applications in a broad variety of industries including consumer, automotive, medical, aerospace, defense, green energy, industrial, and other markets.

MEMS devices, in particular inertial sensors such as accelerometers and angular rate sensors or gyroscopes, are being used in a steadily growing number of applications. As the number of these applications grow, the greater the demand to add additional functionality and more types of MEMS into a system chip architecture. Due to the significant increase in consumer electronics applications for MEMS sensors such as optical image stabilization (OIS) for cameras embedded in smart phones and tablet PCs, virtual reality systems and wearable electronics, there has been a growing interest in utilizing such technology for more advanced applications which have been traditionally catered to by much larger, more expensive and higher grade non-MEMS sensors. Such applications include single- and multiple-axis devices for industrial applications, inertial measurement units (IMUs) for navigation systems and attitude heading reference systems (AHRS), control systems for unmanned air, ground and sea vehicles and for personal indoor GPS-denied navigation. These applications also may include healthcare/medical and sports performance monitoring and advanced motion capture systems for next generation virtual reality. These advanced applications often require lower bias drift and higher sensitivity specifications well beyond the capability of existing consumer-grade MEMS inertial sensors on the market. In order to expand these markets and to create new ones, it is desirable and necessary that higher performance specifications be developed. It is also necessary to produce a low cost and small size sensor and/or MEMS inertial sensor-enabled system(s).

Advanced applications generally require lower bias drift and higher sensitivity specifications beyond existing consumer-grade MEMS inertial sensors. However, given that MEMS motion sensors such as accelerometers and gyroscopes are typically much smaller than traditional mechanical gyroscopes, they tend to be subject to higher mechanical noise and drift. Also, since position and attitude are calculated by integrating the acceleration and angular rate data, respectively, noise and drift lead to growing errors in position. The mechanical noise spectrum $F_{noise}$ of a resonator can be expressed as $F_{noise}=(4k_B Tm\omega_0/Q)^{1/2}$, where $k_B T$ is the thermal noise, m is the inertial mass, $\omega_0$ is the resonant frequency, and Q is the resonance quality factor. The noise equivalent acceleration $a_{noise}$ for an accelerometer (F=ma) can therefore be expressed as $a_{noise}=(4k_B T\omega_0/mQ)^{1/2}$, while the noise equivalent angular rate for a gyroscope (F=2mvΩ) is $\Omega_{noise}=(k_B T/Q\omega_0 A^2)^{1/2}$, where A is the gyroscope drive amplitude. It follows that increasing the mass m and quality factor Q can reduce mechanical noise. Because large Q values tend to make the design of sensing electronics more difficult and expensive, increasing the mass m is generally more desirable. Most modern commercial inertial sensors use thin film micromachining techniques to fabricate the MEMS, leading to thin masses with thickness ranging from about 1 to about 40 micrometers (μm). For these types of MEMS sensors, increasing the mass typically involves increasing the surface area of the mass perpendicular to its thickness. In turn, such an increase in the surface area of the mass can lead to larger chip footprints and higher cost. Accordingly, various challenges still exist for the design of low-noise MEMS motion sensors.

SUMMARY

In accordance with an aspect, there is provided a micro-electro-mechanical system (MEMS) motion sensor including:
  a MEMS wafer having opposed top and bottom sides and including a frame structure, a plurality of proof masses, and a plurality of spring assemblies each suspending a corresponding one of the proof masses from the frame structure and enabling the corresponding one of the proof masses to move along mutually orthogonal first, second and third axes;
  top and bottom cap wafers respectively bonded to the top and bottom sides of the MEMS wafer, the top cap, bottom cap and MEMS wafers being electrically conductive, the top cap wafer, bottom cap wafer and frame structure together defining one or more cavities each enclosing one or more of the plurality of proof masses, each proof mass being enclosed in one of the one or more cavities;
  top and bottom electrodes respectively provided in the top and bottom cap wafers and forming capacitors with the plurality of proof masses, the top and bottom electrodes being together configured to detect motions of the plurality of proof masses;
  first and second sets of electrical contacts provided on the top cap wafer, the first set of electrical contacts being electrically connected to the top electrodes, and the second set of electrical contacts being electrically connected to the bottom electrodes by way of insulated conducting pathways extending successively through the bottom cap wafer, the frame structure of the MEMS wafer and the top cap wafer.

In some embodiments, the MEMS motion sensor is configured as a six-degree-of-freedom (6-DOF) motion sensor enabling three-axis linear acceleration and angular rate measurements.

In some embodiments, top and bottom electrodes form a plurality of electrode assemblies each electrode assembly including at least one pair of the top and/or bottom electrodes. The plurality of electrode assemblies includes:
- a first sensing electrode assembly associated with one or more of the plurality of proof masses and configured to detect a translational motion of the one or more proof masses associated with the first sensing electrode assembly along the first axis, the translational motion being indicative of a linear acceleration along the first axis;
- a second sensing electrode assembly associated with one or more of the plurality of proof masses and configured to detect a rotation of the one or more proof masses associated with the second sensing electrode assembly about the third axis, the rotation about the third axis being indicative of a linear acceleration along the second axis;
- a third sensing electrode assembly associated with one or more of the plurality of proof masses and configured to detect a rotation of the one or more proof masses associated with the third sensing electrode assembly about the second axis, the rotation about the second axis being indicative of a linear acceleration along the third axis;
- a first driving electrode assembly associated with and configured to drive a motion of one or more associated ones of the plurality of proof masses along the first axis at an out-of-plane drive frequency;
- a fourth sensing electrode assembly associated with the one or more proof masses associated with the first driving electrode assembly and configured to sense a Coriolis-induced, rocking motion of the one or more proof masses associated with the first driving electrode assembly along the third axis, the Coriolis-induced, rocking motion along the third axis being indicative of an angular rate about the second axis;
- a fifth sensing electrode assembly associated with the one or more proof masses associated with the first driving electrode assembly and configured to sense a Coriolis-induced, rocking motion of the one or more proof masses associated with the first driving electrode assembly along the second axis, the Coriolis-induced, rocking motion along the second axis being indicative of an angular rate about the third axis;
- a second driving electrode assembly associated with and configured to drive a rocking motion of one or more associated ones of the proof masses along one of the second and third axes at an in-plane drive frequency; and
- a sixth sensing electrode assembly associated with the one or more proof masses associated with the second driving electrode assembly and configured to sense a Coriolis-induced, rocking motion of the one or more proof masses associated with the second driving electrode assembly along the other one of the second and third axes, the Coriolis-induced, rocking motion along the other one of the second and third axes being indicative of an angular rate about the first axis.

In some embodiments, the out-of-plane and in-plane drive frequencies each range from 1 to 100 kilohertz, and each of the first, second and third sensing electrode assemblies are configured to sense the motion of the one or more proof masses associated therewith at an acceleration sensing frequency that is less than between about 30 percent and 50 percent of both the out-of-plane and in-plane drive frequencies.

In some embodiments, the cavity of each mass associated with at least one of the first and second driving electrode assemblies is a hermetically sealed vacuum cavity.

In some embodiments, the plurality of proof masses consists of two proof masses configured as follows:
- a first proof mass associated with the first driving electrode assembly and the first, second, third, fourth and fifth sensing electrode assemblies; and
- a second proof mass associated with the second driving electrode assembly and the sixth sensing electrode assembly.

In some embodiments, the plurality of proof masses consists of three proof masses configured as follows:
- a first proof mass associated with the first driving electrode assembly and the fourth and fifth sensing electrode assemblies;
- a second proof mass associated with the second driving electrode assembly and the sixth sensing electrode assembly; and
- a third proof mass associated with the first, second and third sensing electrode assemblies.

In some embodiments, the plurality of proof masses consists of four proof masses configured as follows:
- first and second proof masses both associated with the first driving electrode assembly and the fourth and fifth sensing electrode assemblies; and
- third and fourth proof masses both associated with the second driving electrode assembly and the sixth sensing electrode assembly, at least one of the four proof masses being further associated with the first, second and third sensing electrode assemblies.

In some embodiments, the plurality of proof masses consists of five proof masses configured as follows:
- first and second proof masses both associated with the first driving electrode assembly and the fourth and fifth sensing electrode assemblies; and
- third and fourth proof masses both associated with the second driving electrode assembly and the sixth sensing electrode assembly; and
- a fifth proof mass associated with the first, second and third sensing electrode assemblies.

In some embodiments, the five proof masses are arranged in a common plane encompassing the second and third axes, the fifth proof mass being located centrally and surrounded by the first, second, third and fourth proof masses.

In some embodiments, the first driving electrode assembly is configured to drive the first proof mass 180 degrees out-of-phase relative to the second proof mass, and the second driving electrode assembly is configured to drive the third proof mass 180 degrees out-of-phase relative to the fourth proof mass.

In some embodiments of the MEMS motion sensor:
- the fourth sensing electrode assembly is configured to form first and second capacitors with the first and second proof masses, respectively, and to measure a difference between a capacitance of the first capacitor and a capacitance of the second capacitor, the difference being indicative of an angular rate of the first and second proof masses about the second axis;
- the fifth sensing electrode assembly is configured to form third and fourth capacitors with the first and second proof masses, respectively, and to measure a difference between a capacitance of the third capacitor and a capacitance of the fourth capacitor, the difference being indicative of an angular rate of the first and second proof masses about the third axis; and the sixth sensing electrode assembly is configured to form fifth and sixth capacitors with the third and fourth proof masses, respectively, and to measure a difference between a capacitance of the fifth capacitor and a capacitance of the sixth capacitor, the difference being indicative of an angular rate of the third and fourth proof masses about the first axis.

In some embodiments of the MEMS motion sensor:

the first sensing electrode assembly comprises top and bottom sensing electrodes respectively located above and below a central region of the fifth proof mass;

the second sensing electrode assembly comprises a pair of top sensing electrodes disposed along a line parallel to the second axis, on opposite sides of the top sensing electrode of the first sensing electrode assembly, and a pair of bottom sensing electrodes disposed along a line parallel to the second axis, on opposite sides of the bottom sensing electrode of the first sensing electrode assembly; and the third sensing electrode assembly comprises a pair of top sensing electrodes disposed along a line parallel to the third axis, on opposite sides of the top sensing electrode of the first sensing electrode assembly, and a pair of bottom sensing electrodes disposed along a line parallel to the third axis, on opposite sides of the bottom sensing electrode of the first sensing electrode assembly.

In some embodiments of the MEMS motion sensor:

the first driving electrode assembly includes:
  a pair of top driving electrodes, one of which being located above a central region of the first proof mass and the other being located above a central region of the second proof mass; and
  a pair of bottom driving electrodes, one of which being located below the central region of the first proof mass and the other being located below the central region of the second proof mass;

the fourth sensing electrode assembly includes:
  a first pair of top sensing electrodes disposed along a line parallel to the third axis, on opposite sides of the top driving electrode located above the central region of the first proof mass;
  a second pair of top sensing electrodes disposed along a line parallel to the third axis, on opposite sides of the top driving electrode located above the central region of the second proof mass;
  a first pair of bottom sensing electrodes disposed along a line parallel to the third axis, on opposite sides of the bottom driving electrode located below the central region of the first proof mass; and
  a second pair of bottom sensing electrodes disposed along a line parallel to the third axis, on opposite sides of the bottom driving electrode located below the central region of the second proof mass; and the fifth sensing electrode assembly includes:
  a first pair of top sensing electrodes disposed along a line parallel to the second axis, on opposite sides of the top driving electrode located above the central region of the first proof mass;
  a second pair of top sensing electrodes disposed along a line parallel to the second axis, on opposite sides of the top driving electrode located above the central region of the second proof mass;
  a first pair of bottom sensing electrodes disposed along a line parallel to the second axis, on opposite sides of the bottom driving electrode located below the central region of the first proof mass; and
  a second pair of bottom sensing electrodes disposed along a line parallel to the second axis, on opposite sides of the bottom driving electrode located below the central region of the second proof mass.

In some embodiments of the MEMS motion sensor:

the second driving electrode assembly includes:
  a first pair of top driving electrodes disposed along a line parallel to the one of the second and third axes, above and laterally offset with respect to a central region of the third proof mass;
  a second pair of top driving electrodes disposed along a line parallel to the one of the second and third axes, above and laterally offset with respect to a central region of the fourth proof mass;
  a first pair of bottom driving electrodes disposed along a line parallel to the one of the second and third axes, below and laterally offset with respect to the central region of the third proof mass; and
  a second pair of bottom driving electrodes disposed along a line parallel to the one of the second and third axes, below and laterally offset with respect to the central region of the fourth proof mass; and the sixth sensing electrode assembly includes:
  a first pair of top sensing electrodes disposed along a line parallel to the other one of the second and third axes, above and laterally offset with respect to a central region of the third proof mass;
  a second pair of top sensing electrodes disposed along a line parallel to the other one of the second and third axes, above and offset with respect to a central region of the fourth proof mass;
  a first pair of bottom sensing electrodes disposed along a line parallel to the other one of the second and third axes, below and laterally offset with respect to a central region of the third proof mass; and
  a second pair of bottom sensing electrodes disposed along a line parallel to the other one of the second and third axes, below and offset with respect to a central region of the fourth proof mass.

In some embodiments, each proof mass and corresponding spring assembly form a resonant structure configured to provide matched or near-matched resonance conditions for angular rate measurements.

In some embodiments, the top cap wafer, bottom cap wafer and MEMS wafer are each made of a silicon-based semiconductor.

In some embodiments, the MEMS wafer is a silicon-on-insulator (SOI) wafer including a device layer, a handle layer under and spaced from the device layer, and an insulating layer sandwiched between the device and handle layers.

In some embodiments, the proof masses each have a thickness and a polygonal cross-section respectively along and perpendicular to the first axis, and the spring assemblies each include flexible springs mechanically connecting the corresponding proof mass to the frame structure, the flexible springs each having a thickness along the first axis that is significantly less than the thickness of the corresponding proof mass.

In some embodiments, the thickness of each of the plurality of proof masses ranges from 10 to 1000 micrometers.

In accordance with another aspect, there is provided a MEMS motion sensor system architecture including:

a MEMS motion sensor as described herein; and an integrated circuit (IC) wafer bonded to the top cap wafer of the MEMS motion sensor, the IC wafer having circuitry electrically connected to the MEMS motion sensor.

In some embodiments, the circuitry of the IC wafer is electrically connected to the first and second sets of electrical contacts of the MEMS motion sensor for routing signals to and from the top and bottom electrodes.

In accordance with another aspect, there is provided a method of measuring acceleration and angular rate along mutually orthogonal first, second and third axes.

The method includes:
(a) providing a MEMS motion sensor including a MEMS wafer having opposed top and bottom sides and including a frame structure, a plurality of proof masses, and a plurality of spring assemblies each suspending a corresponding one of the proof masses from the frame structure and enabling the corresponding one of the proof masses to move along the first, second and third axes, and top and bottom cap wafers respectively bonded to the top and bottom sides of the MEMS wafer, the top cap, bottom cap and MEMS wafers being electrically conductive, the top cap wafer, bottom cap wafer and frame structure together defining one or more cavities each enclosing one or more of the plurality of proof masses, each proof mass being enclosed in one of the one or more cavities;
(b) vibrating one or more of the proof masses along the first axis at an out-of-plane drive frequency;
(c) sensing Coriolis-induced, rocking motions along the third and second axes of the one or more proof masses driven along the first axis, in response to an angular rate about the second and third axes, respectively;
(d) vibrating one or more of the proof masses in a rocking motion along one of the second and third axes at an in-plane drive frequency;
(e) sensing a Coriolis-induced, rocking motion along the other one of the second and third axes of the one or more proof masses driven along the one of the second and third axes, in response to an angular rate about the first axis; and
(f) sensing a translational motion along the first axis, a rotation about the second axis, and a rotation about the third axis of one of the proof masses, indicative of linear accelerations along the first, third and second axes, respectively.

In some embodiments, the plurality of proof masses consists of five proof masses, and:
step (b) includes vibrating first and second ones of the five proof masses along the first axis at the out-of-plane drive frequency;
step (c) includes sensing Coriolis-induced, rocking motions along the third and second axes of the first and second proof masses, in response to an angular rate of the first and second proof masses about the second and third axes, respectively;
step (d) includes vibrating third and fourth ones of the five proof masses in a rocking motion along the one of the second and third axes at the in-plane drive frequency;
step (e) includes sensing a Coriolis-induced, rocking motion along the other one of the second and third axes of the third and fourth proof masses, in response to an angular rate of the third and fourth proof masses about the first axis; and
step (f) includes sensing a translational motion along the first axis, a rotation about the second axis, and a rotation about the third axis of a fifth one of the five proof masses, indicative of linear accelerations along the first, third and second axes of the fifth proof mass, respectively.

In some embodiments, step (b) includes vibrating the first and second proof masses 180 degrees out-of-phase with each other In some embodiments, step (c) includes:
forming first and third capacitors with the first proof mass, and second and fourth capacitors with the second proof mass;
measuring a difference between a capacitance of the first capacitor and a capacitance of the second capacitor, the difference being indicative of the angular rate of the first and second proof masses about the second axis; and
measuring a difference between a capacitance of the third capacitor and a capacitance of the fourth capacitor, the difference being indicative of the angular rate of the first and second proof masses about the third axis.

In some embodiments, step (d) includes vibrating the third and fourth proof masses 180 degrees out-of-phase with each other.

In some embodiments, step (e) includes:
forming fifth and sixth capacitors respectively with the third and fourth proof masses;
measuring a difference between a capacitance of the fifth capacitor and a capacitance of the sixth capacitor, the difference being indicative of the angular rate of the third and fourth proof masses about the first axis.

In some embodiments, step (f) includes sensing the translational motion along the first axis, the rotation about the second axis, and the rotation about the third axis of the fifth proof mass at respective acceleration sensing frequencies that are each less than between 30 percent and 50 percent of both the out-of-plane and in-plane drive frequencies.

In accordance with another aspect, there is provided a method for manufacturing a MEMS motion sensor. The method includes:
a) providing top and bottom cap wafers having respective inner and outer sides; forming insulated conducting cap wafer channels into the top and bottom cap wafers; patterning trenches and filling the trenches to form respective top and bottom electrodes on the inner sides of the top and bottom cap wafers, at least a plurality of the insulated conducting cap wafer channels being electrically connected to the top and bottom electrodes;
b) providing a MEMS wafer having opposed top and bottoms sides, and forming from one of the top and bottom sides, portions of a plurality of proof masses, of flexible springs, and of a frame structure with insulated conducting MEMS wafer channels;
c) bonding the one of the top and bottom sides of the MEMS wafer to the inner side of the corresponding one of the top and bottom cap wafers by aligning the insulated conducting cap wafer channels with the corresponding portions of the insulated conducting MEMS channels, and by aligning the electrodes with the portions of the plurality of proof masses;
d) forming, from the other one of the top and bottom sides of the MEMS wafer, remaining portions of the plurality of proof masses, of the flexible springs, of the frame structure with the insulated conducting MEMS wafer channels;
e) bonding the other one of the top and bottom sides of the MEMS wafer to the inner side of the corresponding other one of the top or bottom cap wafers by aligning the top electrodes with the bottom electrodes and by aligning the insulated conducting cap wafer channels of the corresponding other one of the top or bottom cap wafers with the remaining portions of the insulated conducting MEMS channels;

f) creating insulated conducting pathways, at least a plurality of the insulated conducting pathways extending from the bottom electrodes and successively through the frame structure of the MEMS wafer and the top cap wafer;

g) enclosing the plurality of proof masses within corresponding cavities defined by the top cap wafer, the bottom and bottom cap wafers and by the outer frame of the MEMS wafer; and h) removing top and bottom cap wafer material from the outer sides of the top and bottom cap wafers, respectively to expose and isolate the insulated conducting pathways and the top and bottom electrodes.

Other features and advantages of the embodiments of the present invention will be better understood upon reading of preferred embodiments thereof with reference to the appended drawings.

BRIEF DESCRIPTION OF THE DRAWINGS

FIG. 12 is a schematic, cross-sectional view of the MEMS motion sensor of FIG. 8, taken along section line X, depicting the pair of proof masses and the sensing electrodes involved in-plane angular rate measurements.

FIG. 13 is a schematic, cross-sectional view of the MEMS motion sensor of FIG. 8, taken along section line XIII, depicting the driving electrodes driving the pair of proof masses 180 degrees out-of-phase for out-of-plane angular rate measurements.

Figure 1:
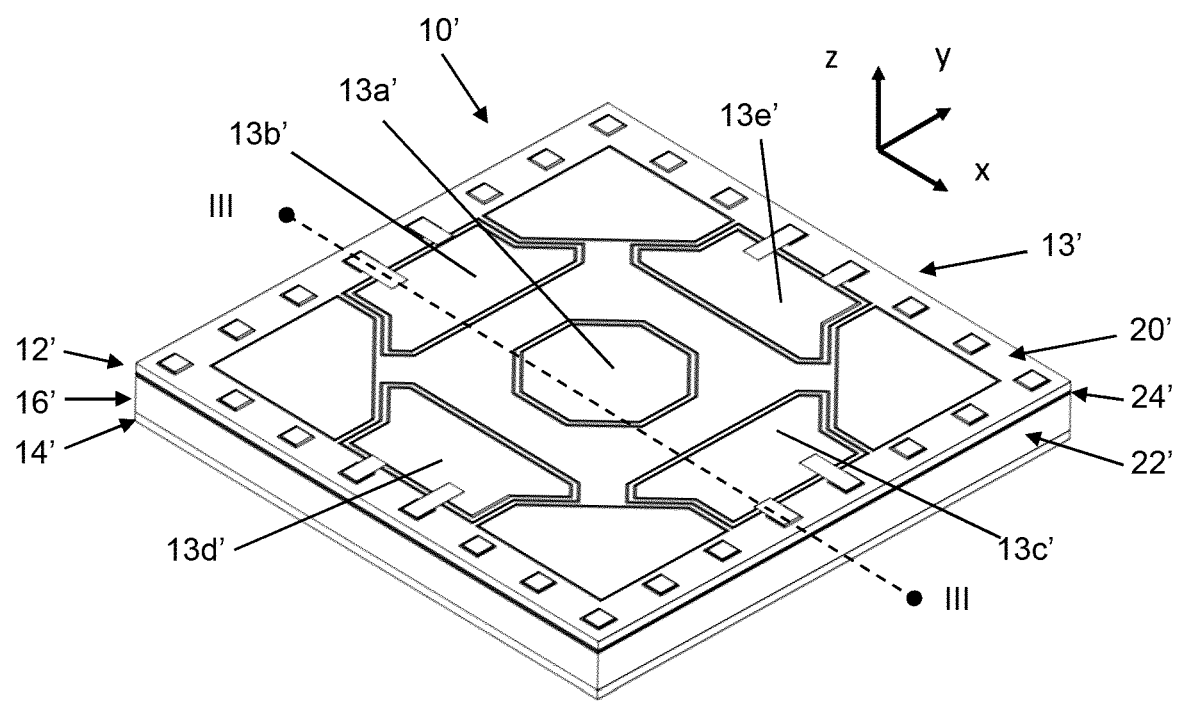
FIG. 1 is a schematic, perspective view of a single-mass MEMS motion sensor.

It should be noted that the appended drawings illustrate only exemplary embodiments of the invention, and are therefore not to be construed as limiting of its scope, for the invention may admit to other equally effective embodiments.

DETAILED DESCRIPTION

In the following description, similar features in the drawings have been given similar reference numerals, and, in order to preserve clarity in the drawings, some reference numerals may be omitted when they were already identified in a preceding figure. It should also be understood that the elements of the drawings are not necessarily depicted to scale, since emphasis is placed upon clearly illustrating the elements and structures of the present embodiments.

General Overview—Multi-Mass MEMS Motion Sensor

The present description generally relates to a MEMS device implemented as a motion sensor having a plurality of pendulous proof masses displaceable along three mutually orthogonal axes and enabling measurements of linear acceleration along and angular rate of rotation about the three mutually orthogonal axes. The present description also generally relates to a method of measuring acceleration and angular rate using such a MEMS motion sensor, as well as to a method of manufacturing such a MEMS motion sensor.

Throughout the present description, the term "motion sensor" refers to a device or system capable of sensing at least linear acceleration and angular rate of rotation, but also possibly any of a number of parameters indicative of a state of motion of an object, such as position, velocity or orientation. In some implementations, the MEMS motion sensor is configured as a six-degree-of-freedom (6-DOF) multi-mass motion sensor enabling three-axis linear acceleration and angular rate of rotation measurements.

Before describing exemplary embodiments of the multi-mass MEMS motion sensor, it is to be noted that 6-DOF capabilities can be achieved using a single-mass MEMS motion sensor.

Figure 2:
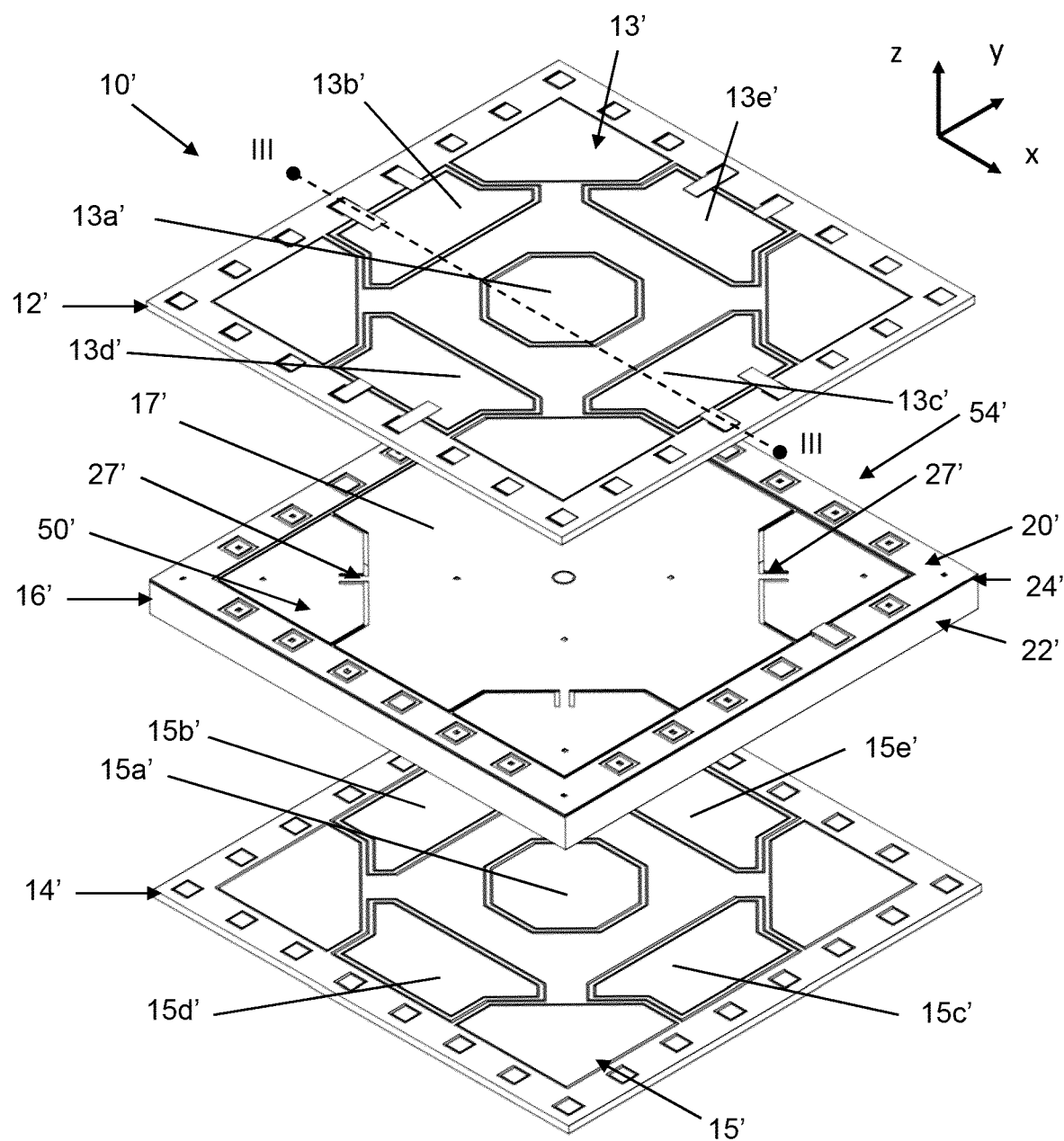
FIG. 2 is a schematic, partially exploded perspective view of the MEMS motion sensor of FIG. 1.

Referring to FIGS. 1 and 2, there are shown perspective and partially exploded perspective views illustrating different components of a single-mass MEMS motion sensor 10'. The sensor 10' includes a single proof mass 17' suspended to a frame structure 50' by a spring assembly 27' that enables motion of the proof mass 17' along mutually orthogonal first, second and third axes, designated as the z, x and y axes in FIG. 1. The proof mass 17' and the spring assembly 27' form a resonant structure 54' and are part of a central MEMS wafer 16' sandwiched between top and bottom cap wafers 12', 14'. The MEMS wafer 16' can be a silicon-on-insulator (SOI) wafer including a device layer 20', a handle layer 22', and an insulating layer 24' (e.g., buried oxide) sandwiched between the device layer 20' and the handle layer 22'. The motion sensor 10 includes top and bottom electrodes 13', 15' respectively provided in the top and bottom cap wafers 12', 14', and forming capacitors with the proof mass 17'. The top and bottom electrodes 13', 15' are configured for driving and sensing a motion of the proof mass 17. In FIGS. 1 and 2, the top and bottom electrodes 13', 15' each include five electrodes, namely a central electrode 13'$a$, 15$a$', two electrodes 13$b$', 13$c$', 15$b$', 15$c$' disposed along the x axis on opposite sides of the central electrode, and two electrodes 13$d$', 13$e$', 15$d$', 15$e$' disposed along the y axis on opposite sides of the central electrode. An example of such a single-mass MEMS motion sensor is provided in co-assigned international PCT patent application No PCT/CA2014/050730 filed Aug. 1, 2014 and entit led "MEMS motion sensor and method of manufacturing".

Referring to FIGS. 3 to 7, the 6-DOF capabilities of the single-mass MEMS motion sensor 10' of FIGS. 1 and 2 will be briefly described.

Figure 3:
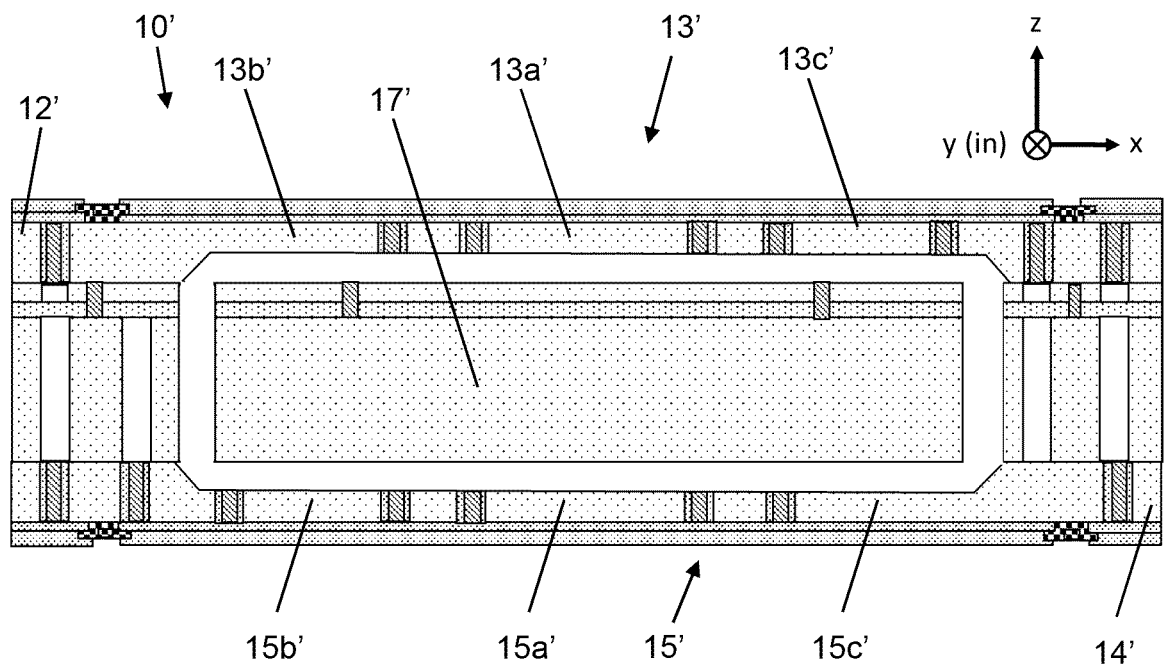
FIG. 3 is a schematic, cross-sectional view of the MEMS motion sensor of FIG. 1, taken along section line III, depicting the position of the proof mass in the absence of acceleration and angular rate.

FIGS. 3 to 6 are cross-sectional views of the single-mass MEMS motion sensor 10' of FIG. 1, taken along line 3. Broadly described, the motion of the singe-mass sensor 10' can be sensed via differential capacitance measurements between the proof mass 17' and one or more of the top electrodes 13' in the top cap wafer 12' and/or one or more of the bottom electrodes 15' in the bottom cap wafer 14'. FIG. 3 illustrates that in absence of acceleration and angular rate, the proof mass 17' is ideally positioned equidistant between the top and bottom electrodes 13', 15' such that the differential capacitance is zero.

Figure 4:
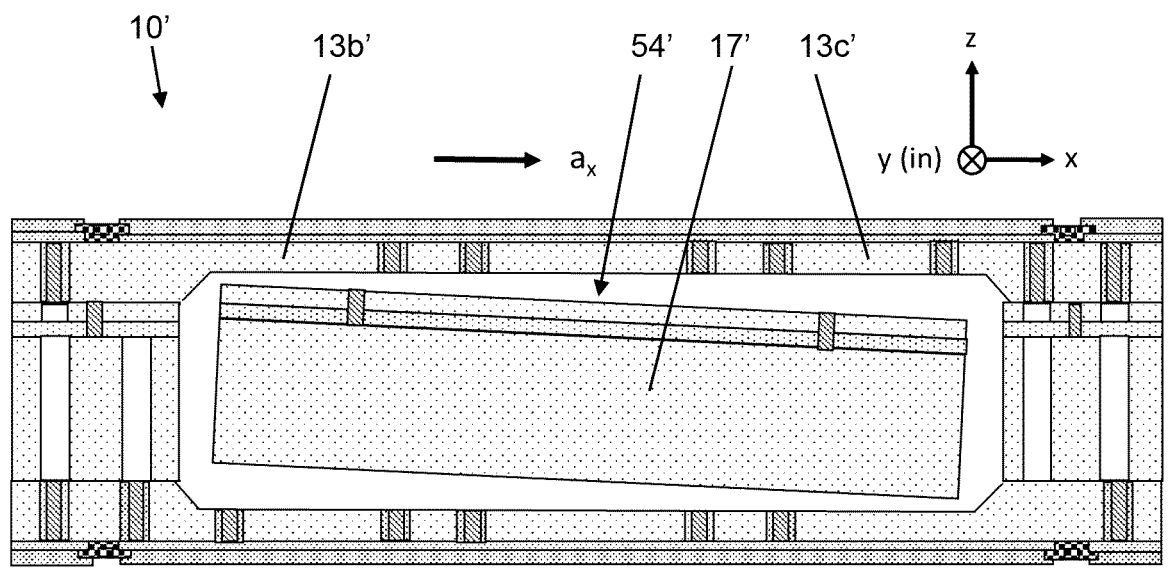
FIG. 4 is a schematic, cross-sectional view of the MEMS motion sensor of FIG. 1, taken along section line III, depicting a rotation of the proof mass about the y axis in response to an acceleration along the x axis.

In FIG. 4, the single-mass sensor 10' is subjected to acceleration $a_x$ along the x axis, which causes the proof mass 17' to rotate around the center of the resonant structure 54' with an axis of rotation parallel to the y axis. This rotation about the y axis leads to a change in differential capacitance proportional to the acceleration $a_x$ along the x axis, for example by measuring the difference of the capacitance between the proof mass 17' and the top electrode 13$b$' and the capacitance between the proof mass 17' and the top electrode 13$c$'. Likewise, an acceleration $a_y$ of the proof mass 17' along the y axis causes the proof mass 17' to rotate around the x axis and can also be sense as a variation in differential capacitance by two or more of the electrodes 13$d$', 13$e$', 15$d$', 15$e$' disposed along the y axis (see FIG. 2).

Figure 5:
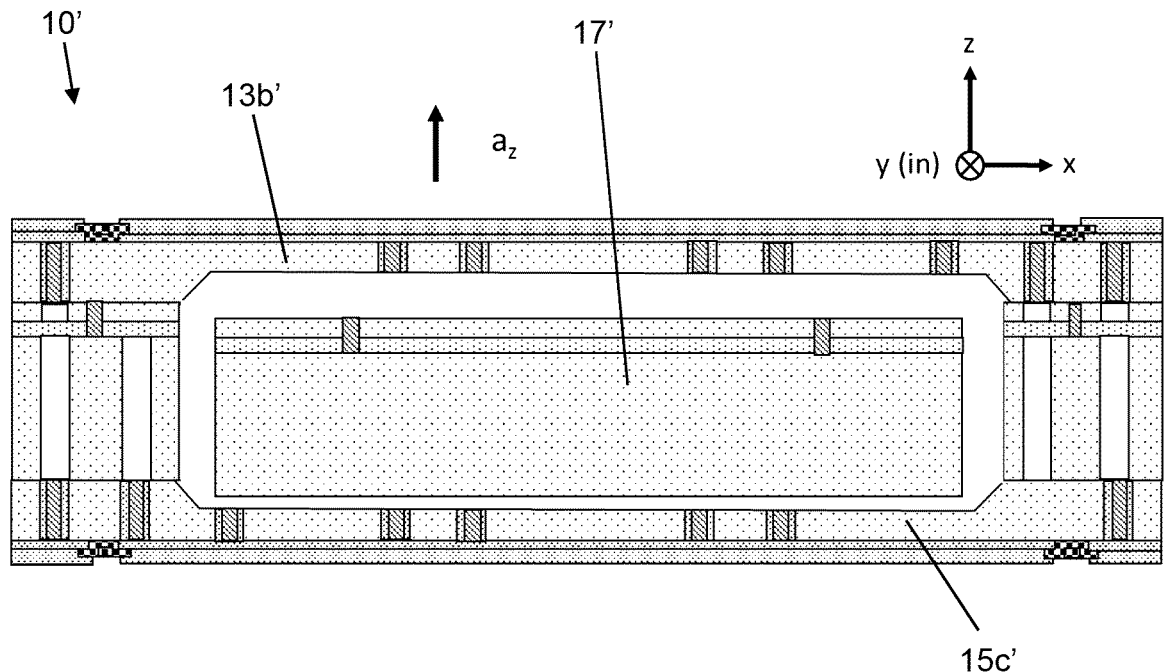
FIG. 5 is a schematic, cross-sectional view of the MEMS motion sensor of FIG. 1, taken along section line III, depicting a translation of the proof mass about the z axis in response to an acceleration along the z axis.

In FIG. 5, the single-mass MEMS motion sensor 10' is accelerated along the z axis, which causes the proof mass 17' to move vertically along the z axis. The acceleration $a_z$ can be measured by monitoring the difference of the capacitance between the proof mass 17' and a top electrode (e.g., 13$b$') and the capacitance between the proof mass 17' and the electrode diagonally opposite (e.g., 15$c$').

Figure 6:
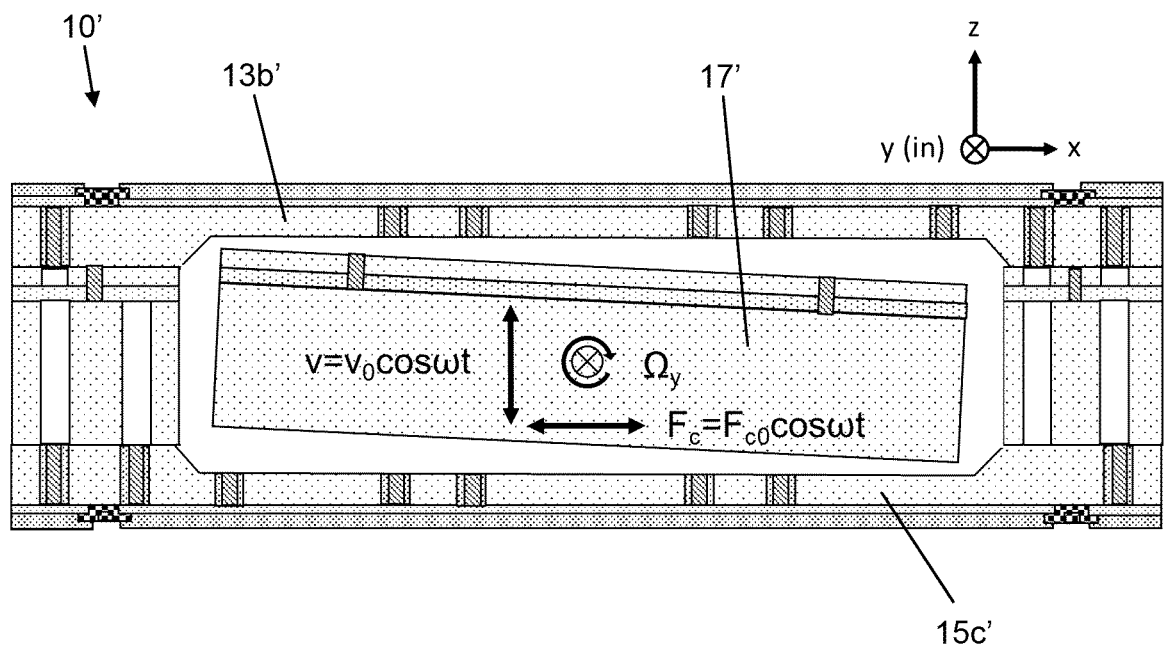
FIG. 6 is a schematic, cross-sectional view of the MEMS motion sensor of FIG. 1, taken along section line III, depicting a Coriolis-induced, rocking motion of the proof mass along the x axis while being driven along the z axis, in response to the sensor being rotated around the y axis.

FIG. 6 illustrates the measurement of angular rate $\Omega_y$ about the y axis using a measurement configuration that relies on the Coriolis effect. The Coriolis effect arises when a mass M moves at velocity $\vec{v}$ in a reference frame rotating with angular rate $\vec{\Omega}$. An observer sitting in the reference rotating frame perceives the mass M to be deflected from its straight-line trajectory by a fictitious force, the Coriolis force, given by $\vec{F}_{Coriolis}=2M\vec{v}\times\vec{\Omega}$, where × denotes the vector cross-product. In FIG. 6, the proof mass 17' is driven resonantly along the z axis. For example, the drive signal can be a time-periodic signal given by $z=z_0 \sin(\omega t)$, which corresponds to a velocity given by $v_z=v_{z0}\cos(\omega t)$. If the single-mass sensor 10' rotates around the y axis at an angular rate of $\Omega_y$, the proof mass 17' will oscillate, as a rocking motion along the x axis, in response to the Coriolis acceleration $\vec{a}_{Coriolis}=2\vec{v}\times\vec{\Omega}=2v_{z0}\Omega_y\cos\omega t\hat{x}=a_{Coriolis}\cos\omega t\hat{x}$. This motion can be measured as an oscillating differential capacitance in a manner similar to the way the linear acceleration $a_x$ is measured. The angular rate $\Omega_x$ about the x axis can be sensed similarly by detecting a variation in differential capacitance in the signal measured by two or more of the electrodes 13$d$', 13$e$', 15$d$', 15$e$' disposed along the y axis (see FIG. 2).

Figure 7:
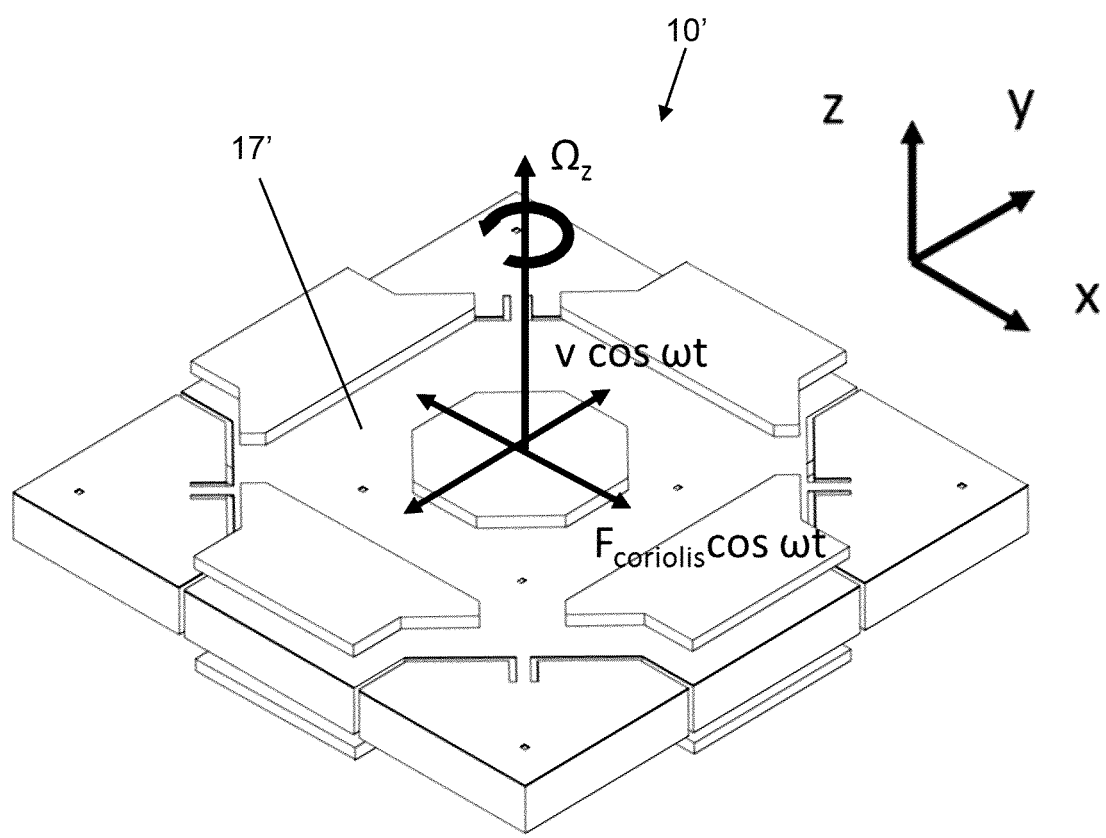
FIG. 7 is a schematic, partial perspective view of the MEMS motion sensor of FIG. 1, depicting a Coriolis-induced, rocking motion of the proof mass along the y axis while being driven along the x axis, in response to the sensor being rotated around the z axis.

Finally, referring to FIG. 7, the angular rate $\Omega_z$ about the z axis can be measured by driving the proof mass 17' in a rocking motion along one of the x and y axes, and by sensing a Coriolis-induced, rocking motion of the proof mass 17' along the other one of the x and y axes.

It is to be noted that although in some applications providing 6-DOF capabilities using single-mass motion sensors may be possible or desirable, compromises often have to be made in order to get an acceptable level of performance. For example, angular rate measurements tend to be more sensitive at a high resonant frequency (e.g., in the range from 10 to 20 kilohertz), less responsive to environmental mechanical noise. In contrast, although linear accelerometers can be used to measure high frequencies (e.g., as vibrometers), generally only low frequencies from direct current (DC) to a few hundred hertz (e.g., 100 to 200 Hz bandwidth around 0 Hz) are useful for navigation applications. Therefore, gyroscopes are typically operated in vacuum with a high Q factor, while accelerometers are typical operated under an ambient pressure to provide damping.

Another reason why multiple proof masses may, in some applications, be preferred over single-mass 6-DOF MEMS motion sensors is the sensitivity of angular rate measurement to linear acceleration. Referring to FIGS. 4 and 6, the measurement of the acceleration $a_x$ along the x axis and the measurement of the angular rate $\Omega_y$ about the y axis are generally made using similar, if not identical, sensing electrodes. In most cases, the only characteristic that distinguishes the two measurements is angular rate is sensed at high (resonant) frequency, while linear acceleration is sensed at low frequency. Measuring the high-frequency angular rate signal, a high-pass filter may be used to remove the low-frequency acceleration signal. However, the low-frequency signal can be several orders of magnitude larger than the angular rate signal so that precision filters may be required to remove it.

A further reason why multiple proof masses may, in some applications, be preferred over single-mass 6-DOF MEMS motion sensors is that when the x and y rocking frequencies are identical (e.g., for a symmetrical proof mass), it can be difficult to separate the signal of the Coriolis-induced, rocking motion along the y axis caused by a resonant drive along the z axis and an angular rate about the x axis from the signal of the Coriolis-induced, rocking motion along the y axis caused by a resonant drive along the x axis and an angular rate about the z axis. Hence, for some applications, the sensor mechanics and electronics could be made simpler if the out-of-plane (i.e., about the z axis) and in-plane (i.e., about the x and y axes) angular rate measurements are carried out using different proof masses.

Therefore, there can be a number of mechanical and electronic reasons and advantages to distribute the DOFs of motion and their associated functions among multiple inertial proof masses, as will now be described.

The MEMS motion sensor according to embodiments of the invention includes multiple proof masses integrated into a single device or chip using a 3DTCV architecture that can enable wafer level integration of MEMS and IC wafers. Additionally, the MEMS motion sensor may be fabricated using a wafer-scale packaging scheme in which each of the proof masses is hermetically sealed in a cavity provided with a number of electrodes above, below and/or around the proof mass to sense, and in some cases drive, its motion.

Broadly described, the MEMS motion sensor according to embodiments of the invention forms a multi-wafer stack that includes a MEMS wafer having opposed top and bottom sides, and top and bottom cap wafers respectively bonded to the top and bottom sides of the MEMS wafer. The top cap, bottom cap and MEMS wafer are electrically conductive. The MEMS motion sensor also includes top and bottom electrodes respectively provided in the top and bottom cap wafers, and first and second sets of electrical contacts provided on the top cap wafer. The MEMS wafer includes a frame structure, a plurality of proof masses, and a plurality of spring assemblies each suspending a corresponding one of the proof masses from the frame structure and enabling the corresponding one of the proof masses to move along mutually orthogonal first, second and third axes. The top cap wafer, bottom cap wafer and frame structure together define one or more cavities. Each cavity encloses one or more of the proof masses, and each proof mass is enclosed in one cavity. The top and bottom electrodes form capacitors with and are together configured to detect motions of the proof masses. The first set of electrical contacts are electrically connected to the top electrodes, while the second set of electrical contacts are electrically connected to the bottom electrodes by way of electrically insulated conducting pathways extending successively through the bottom cap wafer, the frame structure of the MEMS wafer and the top cap wafer. The insulated conducting pathways can also be referred to as "three-dimensional through-chip vias" or "3DTCVs".

The MEMS motion sensor according to embodiments of the invention can not only enable encapsulation of the proof masses, but also make efficient use of the protective top and bottom cap wafers by providing electrodes in the caps as well as insulated conducting pathways. These insulated conducting pathways can allow signals to be routed from the bottom to the top of the MEMS motion sensor where they can be accessed for signal processing, thus allowing for the electrical contacts to be provided only on one side of the sensor. Of course, if needed or desired, electrical contacts may also be placed on the bottom side of the sensor. In some embodiments, the architecture of the MEMS motion sensor may also enable wire-bond-free electrical connection to an IC which can be flip-chip bonded to the top of the MEMS either at the chip or wafer level, which can advantageously reduce complexity and cost of MEMS and IC integration and packaging.

In some embodiments, the MEMS motion sensor includes thick, bulk proof masses to provide higher sensitivity, lower noise, and a larger area for capacitive sensing than current two-dimensional MEMS gyroscope architecture fabricated with planar processes. Yet another advantage of some embodiments of the MEMS device resides in that the bulk proof masses are each suspended from the frame structure by flexible springs whose thickness is significantly less than that of the corresponding proof mass, which enables separate adjustment of the proof mass and spring properties. In particular, in some embodiments, the proof mass can be rather thick, for example up to the thickness of a common silicon wafer (e.g., typically in the 400-700 µm range), while enabling the springs to remain thin and flexible. In this particular example, those skilled in the art will recognize that a 400 µm thick spring could be quite stiff. Also, in such scenarios, the resonant frequencies can be tuned by adjusting the width and thickness of the springs without modifying the proof mass thickness.

First Exemplary Embodiment of a MEMS Motion Sensor: Five Proof Masses

Figure 8:
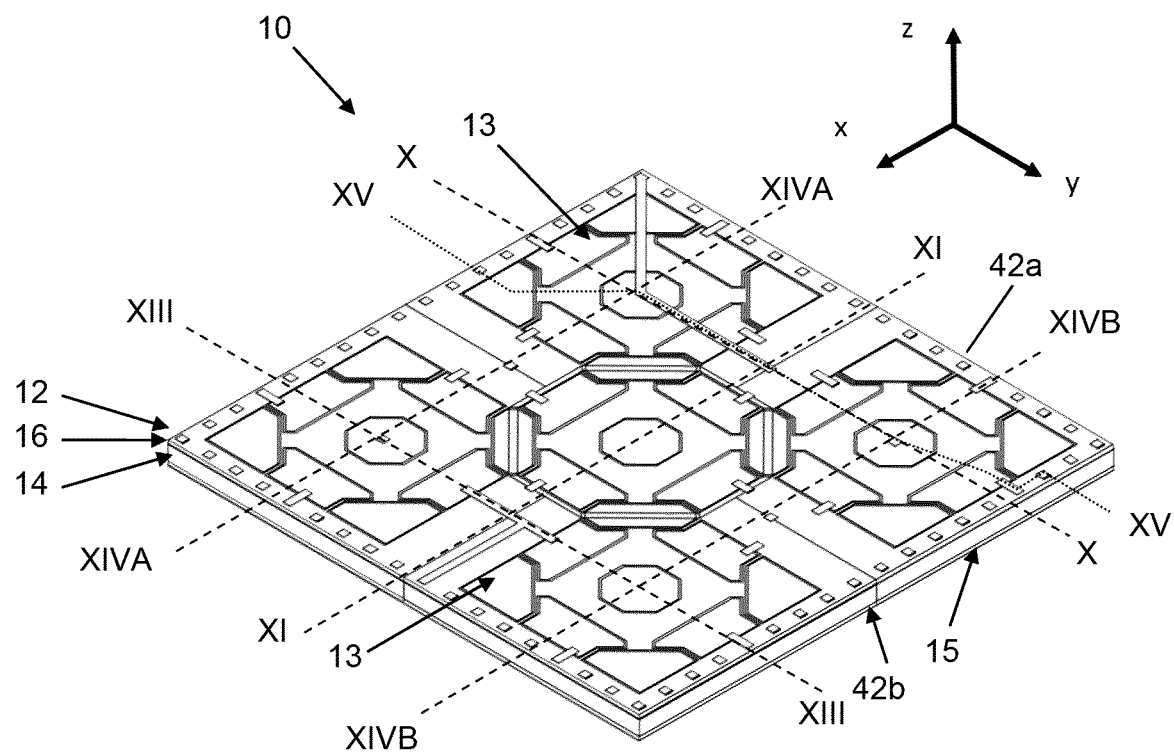
FIG. 8 is a schematic, perspective view of a multi-mass MEMS motion sensor including five proof masses, in accordance with an exemplary embodiment.
Figure 9:
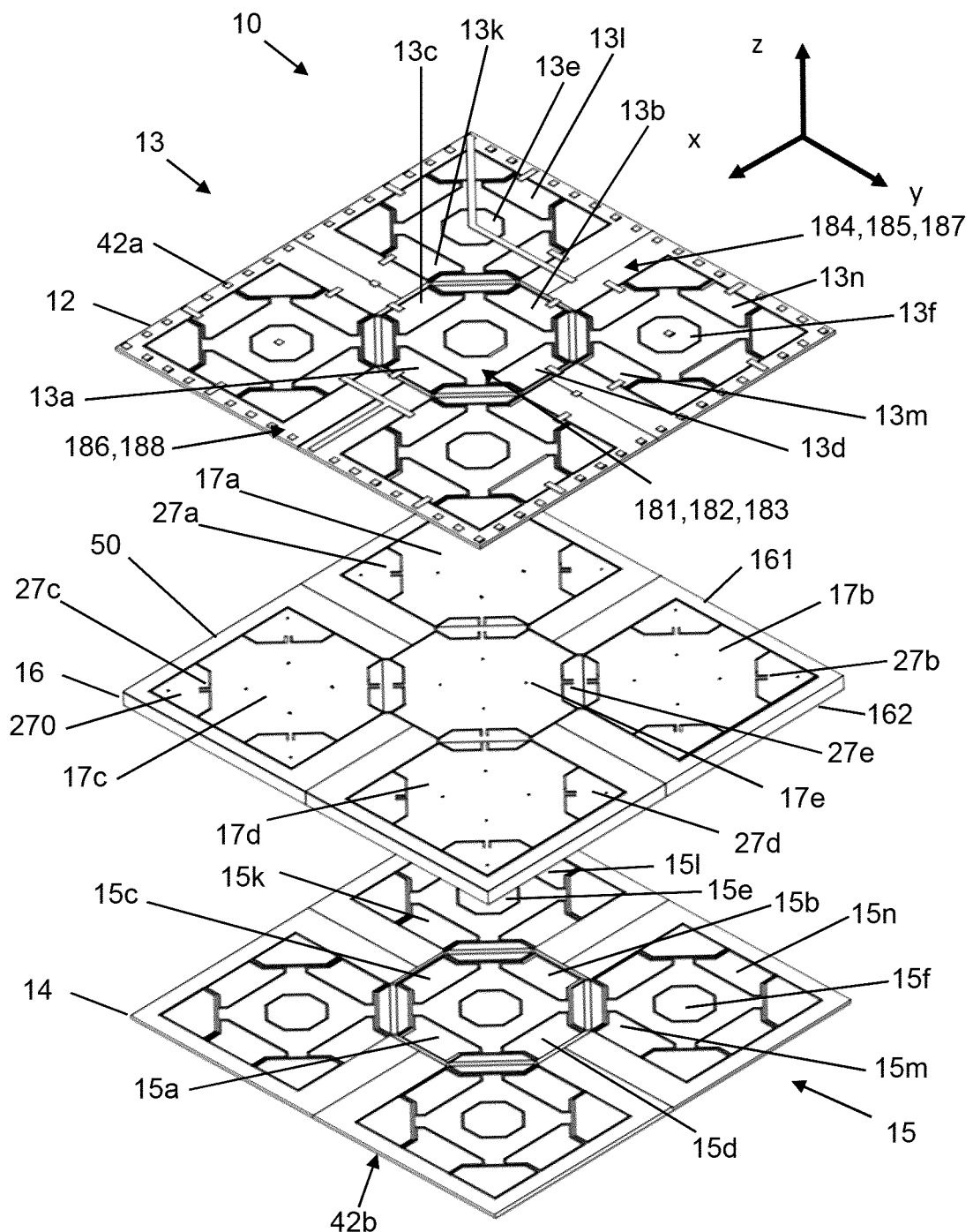
FIG. 9 is a schematic, partially exploded perspective view of the MEMS motion sensor of FIG. 8.
Figure 10:
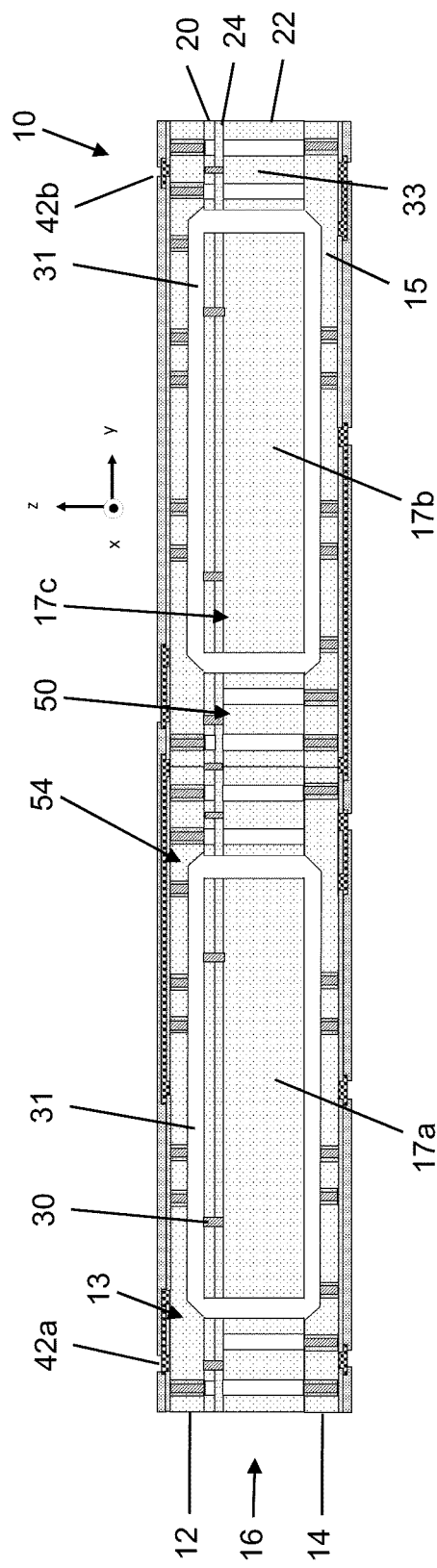
FIG. 10 is a schematic, cross-sectional view of the MEMS motion sensor of FIG. 8, taken along section line X.

Referring to FIGS. 8 to 10, there are depicted a perspective view, a partially exploded perspective view and a cross-sectional view of a multi-mass MEMS motion sensor 10, in accordance with an exemplary embodiment. In the illustrated embodiment, the MEMS motion sensor 10 is implemented as a 6-DOF motion sensor configured for three-axis linear acceleration and three-axis angular rate measurements. It is to be noted that throughout the present description, and unless stated otherwise, the terms "MEMS device" and "MEMS motion sensor" are used interchangeably.

MEMS, Top Cap and Bottom Cap Wafers

In FIGS. 8 to 10, the MEMS motion sensor 10 first includes a MEMS wafer 16 having opposed top and bottom sides 161, 162, and top and bottom cap wafers 12, 14 respectively bonded to the top and bottom sides 161, 162 of the MEMS wafer 16. The MEMS wafer 16 can be a SOI wafer including a device layer 20, a handle layer 22 under and spaced from the device layer 20, and an insulating layer 24 (e.g., buried oxide) sandwiched between the device and handle layers 20, 22. In the illustrated embodiment, the top cap wafer 12 is bonded to and in electrical contact with selected portions of the device layer 20, while the bottom cap wafer 14 is bonded to and in electrical contact with selected portions of the handle layer 22. The device layer 20 and the handle layer 22 of the MEMS wafer 16, as well as the top and bottom cap wafers 12, 14 are made of electrically conductive material such as, for example, a silicon-based semiconductor material. The insulating layer 24 acts to insulate the top half of the sensor 10 from the bottom half. In some implementations, electrical shunts 30 can be formed through the insulating layer 24 to allow electrical connections to be established between the device layer 20 and the handle layer 22 at desired places.

The MEMS wafer 16 includes a frame structure 50, a plurality of proof masses 17a to 17e, and a plurality of spring assemblies 27a to 27e. Each spring assembly 27a to 27e suspends a corresponding one of the proof masses 17a to 17e from the frame structure 50 and enables the corresponding one of the proof masses to move along mutually orthogonal first, second and third axes. As depicted in FIG. 8, the first, second and third axes are designated for definiteness as the z, x and y axes, respectively, and will be so referred to herein. In particular, in the exemplary embodiment of FIGS. 8 to 10, the x and y axes may be referred to as "in-plane", "lateral" or "horizontal" directions, while the z axis may be referred to as an "out-of-plane", transverse" or "vertical" direction.

Also, throughout the present description, terms such as "top" and "bottom", "above" and "below", "over" and "under", "upper" and "lower", and other like terms indicating the position of one element with respect to another element are used herein for ease and clarity of description, as illustrated in the figures, and should not be considered limitative. It will be understood that such spatially relative terms are intended to encompass different orientations of the MEMS motion sensor in use or operation, in addition to the orientation exemplified in the figures. In particular, the terms "top" and "bottom" are used to facilitate reading of the description, and those skilled in the art of MEMS will readily recognize that, when in use, MEMS devices can be placed in different orientations such that, for example, the top and bottom cap wafers are positioned upside down. It will further be understood that the term "over" and "under" in specifying the spatial relationship of one element with respect to another element denotes that the two elements are either in direct contact with or separated by one or more intervening elements.

Frame Structure, Proof Masses and Spring Assemblies

The term "frame structure" is intended to refer broadly to any structure that holds and mechanically supports the proof masses such that the proof masses can move relative to the support assembly along the x, y and z axes. In FIGS. 8 to 10, the frame structure 50 is embodied by the portions of the MEMS wafer 16 spaced from and laterally enclosing the proof masses 17a to 17e. Also, the term "proof mass" is intended to refer broadly to any predetermined inertial mass used in a MEMS motion sensor whose motion can serve as a reference for a motion to be measured (e.g., linear acceleration, angular rate, and the like).

In the exemplary embodiment of FIGS. 8 to 10, the MEMS motion sensor 10 is provided with five proof masses 17a to 17e, where the first and second proof masses 17a, 17b can be used for in-plane angular rate measurements around the x and y axes, the third and fourth proof masses 17c, 17d can be used for out-of-plane angular rate measurements around the z axis, and the fifth proof mass 17e can be used for linear acceleration measurements along the x, y and z axes. In this configuration, in-plane and out-of-plane angular rate measurements are made using different pairs of proof masses. Also, by assigning the 3-DOF acceleration measurements to a separate proof mass, the sensitivity of angular rate measurement to linear acceleration can be reduced.

In the illustrated embodiment, the five proof masses 17a to 17e are arranged in a common plane encompassing the x and y axes. In this exemplary configuration, the fifth proof mass 17e is located centrally and surrounded by the other four proof masses 17a to 17d. Of course, various other symmetrical or non-symmetrical spatial arrangements of the proof masses can be used in other embodiments without departing from the scope of the present invention. Likewise, configurations with two, three, four or more than five proof masses could be employed in other embodiments, as will discussed further below.

Each proof mass may be described in terms of a thickness and a cross-section respectively along and perpendicular to the z axis. For example, in the illustrated embodiment, each proof mass consists of an octagonal central region provided with rectangular lobes extending outwardly from the central region along the x and y axes. Of course, in other embodiments, the proof masses may assume a variety of shapes, polygonal or not, and sizes which may but need not be the same for each proof mass. For example, in some embodiments, the first and second proof masses 17a, 17b used for x and y angular rate measurements may be identical to each other by different from the other proof masses 17c to 17e, and likewise for the third and fourth proof masses 17c, 17d used for z angular rate measurements.

As used herein, the term "spring assembly" is intended to refer to any suitable flexible structure configured to suspend a proof mass in spaced relationship from the frame structure and to enable motion of the proof mass relative to the frame structure along three mutually orthogonal axes in response to a motion experienced by the MEMS motion sensor. In FIGS. 8 to 10, the spring assembly 27a to 27e of each proof mass 17a to 17e includes four flexible springs 270, each of which mechanically connects and provides a restoring force between the frame structure 50 and the corresponding proof mass 17a to 17e. Of course, the type, number, position and arrangement of the flexible springs can be varied in other embodiments. Likewise, in a given embodiment of the MEMS motion sensor, the flexible springs associated with different proof masses may be different.

Each proof mass 17a to 17e and the corresponding spring assembly 27a to 27e may form a resonant structure 54 supporting a number of oscillation modes, each characterized by one or more resonant frequencies whose values can be set by adjusting the mechanical and geometrical properties of the resonant structure (e.g., the width and thickness of the springs and the size and shape of the proof mass). For example, in the embodiment of FIGS. 8 to 10, the relative sizes of the lobes and central region of each proof mass can be varied in tandem with the dimensions of the springs 270 to adjust the resonant frequencies of the resonant structure 54.

In FIGS. 8 to 10, the proof masses 17a to 17e are patterned in both the device and handle layers 20, 22, while the spring assemblies 27a to 27e are patterned only in the device layer 20. Accordingly, the thickness along the z axis of the flexible springs 270 of the spring assemblies 27a to 27e can be made significantly less than the thickness of the corresponding proof masses 17a to 17e. For example, in some embodiments, the thickness of the proof masses 17a to 17e can be greater than 10 µm up to as thick as the SOI MEMS wafer 16, which typically ranges from about 400 to 700 µm, and even up to 1000 µm, whereas the thickness of the flexible springs 270 can be of the order of 1 to 10 µm. Therefore, in some embodiments, the ratio of the thickness of one of the proof masses to the thickness of the corresponding flexible springs can be larger than 40. As mentioned above, providing a MEMS motion sensor in which the thickness of the proof masses significantly exceeds that of the flexible springs can prove advantageous. This is because the proof mass can consist of the entire thickness of the SOI MEMS wafer, while the springs can be kept thin and, thus, flexible enough to maintain the resonant frequencies at reasonably low values (e.g., of the order of tens of kilohertz).

Cavities Enclosing the Proof Masses

Referring still to FIGS. 8 to 10, the top cap wafer 12, bottom cap wafer 14 and frame structure 50 define, when bonded together, one or more cavities 31, or chambers, each of which encloses one or more of the proof masses 17a to 17e, such that each proof mass is enclosed within a cavity 31. In some embodiments, the pressure in each cavity 31 can be adjusted independently. In particular, in some embodiments, the proof masses used for angular rate measurement are advantageously enclosed in respective vacuum cavities. For example, in the illustrated embodiment, the cavities 31 enclosing the first, second, third and fourth proof masses 17a to 17d, which are used for angular rate measurements, can be hermetically sealed vacuum cavities, which may not be the case for the fifth proof mass 17e used for linear acceleration measurements. Also, although each proof mass is enclosed its own cavity in FIGS. 8 to 10, in other embodiments, the number of cavities may be less than the number of proof masses. In particular, the number and arrangement of the cavities may be dictated by environmental (e.g., high or low pressure) and/or mechanical (e.g., support integrity) considerations.

Top and Bottom Electrodes

Referring still to FIGS. 8 to 10, the MEMS motion sensor 10 also includes top and bottom electrodes 13, 15 respectively provided in the top and bottom cap wafers 12, 14 and forming capacitors with the plurality of proof masses 17a to 17e. The top and bottom electrodes 13, 15 are together configured to detect motions of the plurality of proof masses, namely linear accelerations along and angular rate about three mutually orthogonal axes. In some implementations, the top and bottom electrodes 13, 15 form eight electrode assemblies 181 to 188, where each of the electrode assemblies 181 to 188 includes at least one pair of electrodes. Each pair of electrodes is further composed of two of the top electrodes 13 or two of the bottom electrodes 15 or one each of the top and bottom electrodes 13, 15.

It will be understood that the subdivision of the top and bottom electrodes 13, 15 into such electrode assemblies 181 to 188 is made from a functional or conceptual standpoint and that, in practice, a given "physical" top or bottom electrode 13, 15 may be part of more than one electrode assembly 181 to 188, and that the functions performed by two or more electrode assemblies 181 to 188 may be performed by the same "physical" electrode 13, 15 without departing from the scope of the present invention.

Linear Acceleration Measurements

In order to provide three-axis linear acceleration sensing capabilities, the electrode assemblies 181 to 188 can include first, second and third sensing electrode assemblies 181 to 183, each associated with one or more proof masses 17. In the embodiment of FIGS. 8 to 10, the first, second and third sensing electrode assemblies 181 to 183 are each associated with the fifth proof mass 17e, which thus acts as a 3-DOF accelerometer. In particular, the fifth proof mass 17e is configured to move vertically along the z axis in response to a z-directed acceleration and to rotate about the x and x axes in response to y- and x-directed accelerations, respectively. The first sensing electrode assembly 181 is configured to detect a translational motion of the fifth proof mass 17e along the z axis, the translational motion being indicative of a linear acceleration along the z axis. The second sensing electrode assembly 182 is configured to detect a rotation of the fifth proof mass 17e about the y axis, the rotation being indicative of a linear acceleration along the x axis. The third sensing electrode assembly 183 is configured to detect a rotation of the fifth proof mass 17e about the x axis, the rotation being indicative of a linear acceleration along the y axis.

Figure 11:
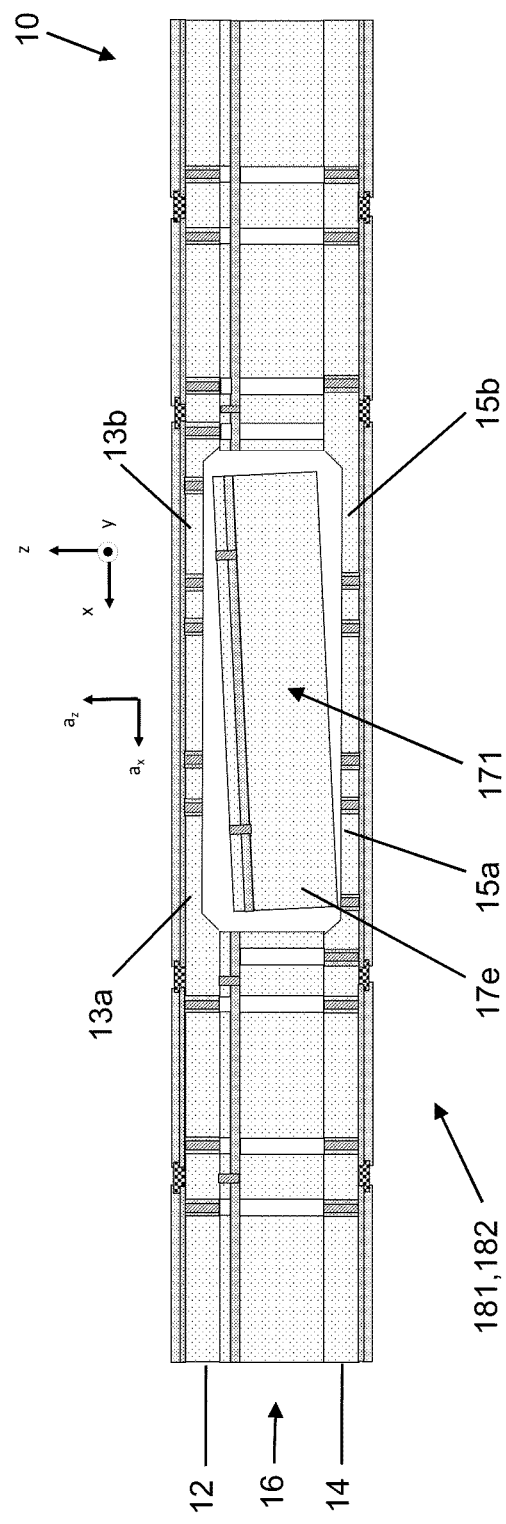
FIG. 11 is a schematic, partial cross-sectional view of the MEMS motion sensor of FIG. 8, taken along section line XI, depicting the proof mass used for linear acceleration measurements along the x, y and z axes.

Turning to FIGS. 9 and 11, in some embodiments, the first, second and third sensing electrode assemblies 181 to 183 consist of four top and four bottom sensing electrodes forming capacitors with the fifth proof mass 17e and including:

a first pair of top sensing electrodes 13a, 13b disposed along a line parallel to the x axis, above and laterally offset with respect to a central region 171 of the fifth proof mass 17e;

a first pair of top bottom sensing electrodes 15a, 15b disposed along a line parallel to the x axis, below and laterally offset with respect to a central region 171 of the fifth proof mass 17e;

a second pair of top sensing electrodes 13c, 13d disposed along a line parallel to the y axis, above and laterally offset with respect to a central region 171 of the fifth proof mass 17e; and a second pair of top bottom sensing electrodes 15c, 15d disposed along a line parallel to the y axis, below and laterally offset with respect to a central region 171 of the fifth proof mass 17e.

Of course, the number and arrangement of electrodes can vary depending on the application in which the MEMS motion sensor is to be used.

For this electrode configuration, the acceleration $a_x$, $a_y$ and $a_z$ can be determined using differential capacitance measurements. For example, by measuring the difference of the capacitance between the fifth proof mass 17e and the electrode 13a (or 15a) and the capacitance between the fifth proof mass 17e and the electrode 13b (or 15b), the displacement of the fifth proof mass 17e along the z axis is subtracted out and $a_x$ can be measured. The acceleration component $a_y$ can be obtained in a similar manner from the difference between the capacitances measured by the electrode 13c (or 15c) and the electrode 13d (or 15d). Furthermore, by taking the difference between the capacitances measured by the electrode 13a (or 13b) and the electrode 15b (or 15a), the displacement of the fifth proof mass 17e along the x axis is subtracted out and $a_z$ can be measured.

Angular Rate Measurements

Referring back to FIGS. 8 to 10, in order to provide three-axis angular rate sensing capabilities, the electrode assemblies 181 to 188 can include first and second driving electrode assemblies 187, 188, and fourth, fifth and sixth sensing electrode assemblies 184 to 186, each of these driving and sensing electrode assemblies 183 to 188 being associated with one or more proof masses 17. In the embodiment of FIGS. 8 to 10, the first driving and fourth and fifth sensing electrode assemblies 187, 184, 185 are each associated with the second and third proof masses 17a, 17b, and are therefore used to measure in-plane angular rates about the x and y axes. Meanwhile, the second driving and sixth sensing electrode assemblies 188, 186 are each associated with the third and fourth proof masses 17c, 17d, and are therefore used to measure out-of-plane angular rates about the z axis. In the illustrated embodiment, the electrodes associated with the first driving electrode assembly 187 are located in corresponding above and below central regions 171 of the first and second proof masses 17a, 17b, while the electrodes associated with the second driving and fourth, fifth and sixth electrode assemblies 188, 184 to 186 are located above and below but laterally from the central regions of the first, second, third and fourth proof masses 17a to 17b. Of course, various other electrode arrangements could be used in other embodiments.

Referring to FIG. 12, the first driving electrode assembly 187 is configured to drive a vertical motion of each of the first and second proof masses 17a, 17b along the first axis at an out-of-plane drive frequency. For example, the drive signal can be a time-periodic sinusoidal signal. Depending on the application, the out-of-plane drive frequency may or not correspond to a resonant frequency of the resonant structures 54 formed by each of the first and second proof masses 17a, 17b and their associated spring assemblies. In the illustrated embodiment, the first driving electrode 187 assembly is configured to drive the first proof mass 17a 180 degrees out-of-phase relative to the second proof mass 17b. For this purpose, the first driving electrode assembly 187 can include a pair of top driving electrodes 13e, 13f, one of which being located above a central region 171 of the first proof mass 17a and the other being located above a central region 171 of the second proof mass 17b, and a pair of bottom driving electrodes 15e, 15f, one of which being located below the central region 171 of the first proof mass 17a and the other being located below the central region 171 of the second proof mass 17b.

Referring still to FIG. 12, the fourth sensing electrode assembly 184 is configured to sense a Coriolis-induced, rocking motion of the first and second proof masses 17a, 17b along the y axis, which is indicative of an angular rate $\Omega_x$ about the x axis. In the illustrated embodiment, the fourth sensing electrode assembly 184 forms first and second capacitors with the first and second proof masses 17a, 17b and measures a difference between a capacitance of the first capacitor and a capacitance of the second capacitor. The capacitance difference is indicative of the angular rate $\Omega_x$ to be measured. To measure this capacitance difference, the fourth sensing electrode assembly 184 can include:

a first pair of top sensing electrodes 13g, 13h disposed along a line parallel to the y axis, on opposite sides of the top driving electrode 13e;

a second pair of top sensing electrodes 13i, 13j disposed along a line parallel to the y axis, on opposite sides of the top driving electrode 13f;

a first pair of bottom sensing electrodes 15g, 15h disposed along a line parallel to the y axis, on opposite sides of the bottom driving electrode 15e; and a second pair of bottom sensing electrodes 15i, 15j disposed along a line parallel to the y axis, on opposite sides of the bottom driving electrode 15f;

Of course, the number and arrangement of electrodes can vary depending on the application in which the MEMS motion sensor is to be used.

As the first and second proof masses 17a, 17b are driven vertically 180 degrees out-of-phase by the first driving electrode assembly 187, their respective Coriolis-induced, rocking motions along the y axis when subjected to angular rate about the x axis will also be 180 degrees out-of phase. It will be appreciated that by using two proof masses driven 180 degrees out of phase, the induced Coriolis accelerations of the two proof masses will also be 180 degrees out of phase, whereas any linear acceleration component will have the same effect on each mass. Thus when the signals from corresponding electrodes on the two masses are subtracted, any linear acceleration signals will cancel out.

In this regard, FIG. 12 depicts a snapshot in time of the first and second proof masses 17a, 17b at their maximum amplitude displacement points. Therefore, by synchronously measuring the difference in capacitances of electrodes on similar sides of the two proof masses 17a, 17b (e.g., 13g and 13i, or 13h and 13j), the time-dependent capacitance change due to the angular rate around the x axis is obtained since the angular rate signals ($C_0$+/−$\Delta C_{Coriolis}$) on these two electrodes are of opposite sign while the static or low-frequency responses due to y and z acceleration ($C_0$+$\Delta C_x$+$\Delta C_z$), being of the same sign, are subtracted out. Of course, other electrode configurations involving or not differential capacitance measurements can be used in other embodiments.

It is to be noted that by proper selection or adjustment of the mechanical and/or geometrical properties of the first and second proof masses 17a, 17b and their associated spring assemblies, the resonant frequencies of the oscillation modes involved in the measurement of the angular rate $\Omega_x$ about the x axis can be tailored to provide either matched or nearly matched resonance conditions between the driving and sensing modes, where the driving and sensing resonant frequencies of the driving and sensing modes are equal or close to each other, or unmatched resonance conditions between the driving and sensing modes, where driving and sensing resonant frequencies are substantially different from each other.

Referring back to FIGS. 8 to 10, the fifth sensing electrode assembly 185 is configured to sense a Coriolis-induced, rocking motion of the first and second proof masses 17a, 17b along the x axis, which is indicative of an angular rate $\Omega_y$ about the y axis. In the illustrated embodiment, the fifth sensing electrode assembly 185 forms third and fourth capacitors with the first and second proof masses 17a, 17b and measures a difference between a capacitance of the third capacitor and a capacitance of the fourth capacitor. The capacitance difference is indicative of the angular rate $\Omega_y$ to be measured. To measure this capacitance difference, the fifth sensing electrode assembly 185 can include:

a first pair of top sensing electrodes 13k, 13l disposed along a line parallel to the x axis, on opposite sides of the top driving electrode 13e;

a second pair of top sensing electrodes 13m, 13n disposed along a line parallel to the x axis, on opposite sides of the top driving electrode 13f;

a first pair of bottom sensing electrodes 15k, 15l disposed along a line parallel to the x axis, on opposite sides of the bottom driving electrode 15e; and a second pair of bottom sensing electrodes 15m, 15n disposed along a line parallel to the x axis, on opposite sides of the bottom driving electrode 15f;

Of course, the number and arrangement of electrodes can vary depending on the application in which the MEMS motion sensor is to be used.

For this configuration of the fifth sensing electrode assembly 185, the angular rate $\Omega_y$ about the y axis can be determined using differential capacitance measurements involving the first and second proof masses 17a, 17b being driven 180 degrees out-of-phase from each other, as in FIG. 12 for $\Omega_x$. Of course, other electrode configurations involving or not differential capacitance measurements can be used in other embodiments. Also, like in the measurement of $\Omega_x$, the measurement of the angular rate $\Omega_y$ can be performed either with matched or nearly matched driving and sensing modes or with unmatched driving and sensing modes.

Figure 14A:
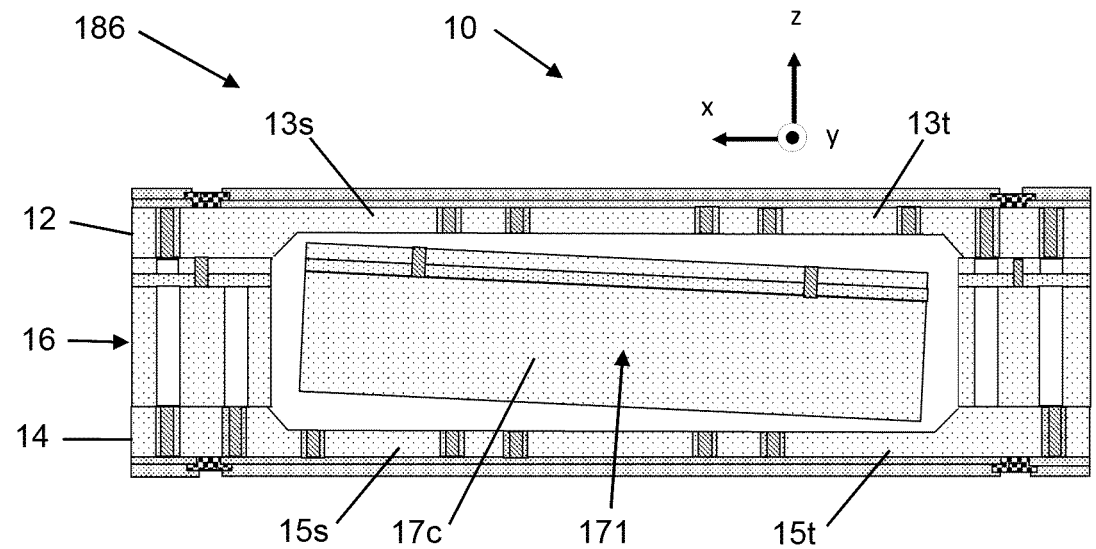
FIGS. 14A and 14B are schematic, partial cross-sectional views of the MEMS motion sensor of FIG. 8, respectively taken along section lines XIVA and XIVB, depicting the pair of proof masses and the sensing electrodes involved in out-of-plane angular rate measurements.
Figure 14B:
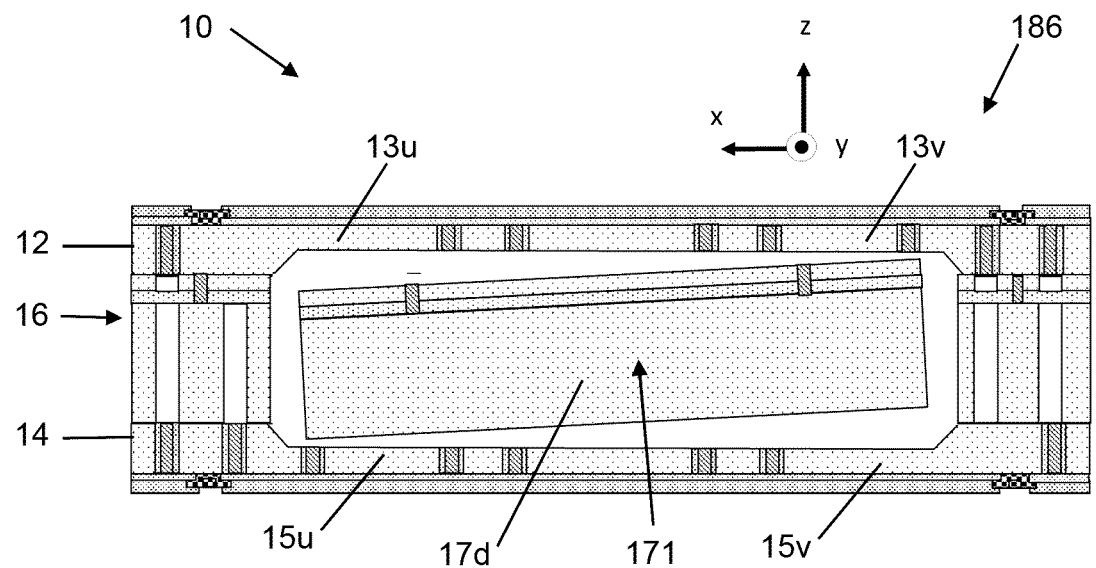

Referring now to FIGS. 13, 14A and 14B, it will be understood that for the illustrated embodiment of the MEMS motion sensor 10, the angular rate $\Omega_z$ around the z axis is to be measured differently than around the x and y axes since the drive axis has to be perpendicular to the axis about which the angular rate is to be sensed. Accordingly, in FIG. 13, the second driving electrode assembly 188 is configured to drive a rocking motion of each of the third and fourth proof masses 17c, 17d along the y axis at an in-plane drive frequency. In this regard, FIG. 13 depicts a snapshot in time of the driven third and fourth proof masses 17c, 17d at their maximum driven amplitude displacement points along the y axis. Depending on the application, the in-plane drive frequency may or not correspond to a resonant frequency of the resonant structures 54 formed by each of the first and second proof masses 17c, 17d and their associated spring assemblies. In the illustrated embodiment, the second driving electrode assembly 188 is configured to drive the third proof mass 17c 180 degrees out-of-phase relative to the fourth proof mass 17d. For this purpose, the second driving electrode assembly 188 can include:

a first pair of top driving electrodes 13o, 13p disposed along a line parallel to y axis, above and laterally offset with respect to a central region 171 of the third proof mass 17c;

a second pair of top driving electrodes 13*q*, 13*r* disposed along a line parallel to the y axis, above and laterally offset with respect to a central region 171 of the fourth proof mass 17*d*;

a first pair of bottom driving electrodes 15*o*, 15*p* disposed along a line parallel to y axis, below and laterally offset with respect to the central region 171 of the third proof mass 17*c*; and a second pair of bottom driving electrodes 15*q*, 15*r* disposed along a line parallel to the y axis, below and laterally offset with respect to the central region 171 of the fourth proof mass 17*d*.

Referring still to FIG. 13, in order to drive the third and fourth proof masses 17*c*, 17*d* 180 degrees out-of-phase with each other using the illustrated configuration illustrated for the second driving electrode assembly 188, the vertically aligned top and bottom driving electrodes located above and below one side of the third proof mass 17*c* (e.g., driving electrodes 13*o*, 15*o*) are driven 180 degrees out-of-phase relative to the vertically aligned top and bottom driving electrodes located above and below the other side of the third proof mass 17*c* (e.g., driving electrodes 13*p*, 15*p*) as well as 180 degrees out-of-phase relative to their counterparts on the fourth proof mass 17*d* (e.g., driving electrodes 13*q*, 15*q*). Likewise, the vertically aligned top and bottom driving electrodes located above and below one side of the fourth proof mass 17*d* (e.g., driving electrodes 13*r*, 15*r*) are driven 180 degrees out-of-phase relative to the vertically aligned top and bottom driving electrodes located above and below the other side of the fourth proof mass 17*d* (e.g., driving electrodes 13*q*, 15*q*) as well as 180 degrees out-of-phase relative to their counterparts on the third proof mass 17*c* (e.g., driving electrodes 13*p*, 15*p*).

Turning now to FIGS. 14A and 14B, the sixth sensing electrode assembly 186 is configured to sense a Coriolis-induced, rocking motion of the third and fourth proof masses 17*c*, 17*d* along the x axis, which is indicative of an angular rate $\Omega_z$ about the z axis. In the illustrated embodiment, the sixth sensing electrode assembly 186 forms fifth and sixth capacitors with the third and fourth proof masses 17*c*, 17*d* and measures a difference between a capacitance of the fifth capacitor and a capacitance of the sixth capacitor. The difference is indicative of the angular rate $\Omega_z$ to be measured. To measure this capacitance difference, the six sensing electrode assembly 186 can include:

a first pair of top sensing electrodes 13*s*, 13*t* disposed along a line parallel to the x axis, above and laterally offset with respect to a central region 171 of the third proof mass 17*c*;

a second pair of top sensing electrodes 13*u*, 13*v* disposed along a line parallel to the x axis, above and offset with respect to a central region 171 of the fourth proof mass 17*d*;

a first pair of bottom sensing electrodes 15*s*, 15*t* disposed along a line parallel to the x axis, below and laterally offset with respect to a central region 171 of the third proof mass 17*c*; and a second pair of bottom sensing electrodes 15*u*, 15*v* disposed along a line parallel to the x axis, below and offset with respect to a central region 171 of the fourth proof mass 17*d*.

As the first and second proof masses 17*a*, 17*b* are driven vertically 180 degrees out-of-phase by the first driving electrode assembly 187, their respective Coriolis-induced, rocking motions along the x axis when subjected to angular rate about the z axis will also be 180 degrees out-of phase. In this regard, FIGS. 14A and 14B depict a snapshot in time of the third and fourth proof masses 17*c*, 17*d*, respectively at their maximum amplitude displacement points along the x axis. Therefore, by synchronously measuring the difference in capacitances of electrodes in similar positions on the two masses 17*c*, 17*d* (e.g., 13*s* and 13*u*, or 13*t* and 13*v*, or 15*u* and 15*s*, or 15*t* and 15*v*) the time-dependent capacitance change due to the angular rate around the z axis is obtained since the angular rate signals ($C_0+/-\Delta C_{Coriolis}$) on the two electrodes are of opposite sign while the static or low-frequency responses due to y and z acceleration ($C_0+\Delta C_x+\Delta C_z$), being of the same sign, are subtracted out. Of course, other electrode configurations involving or not differential capacitance measurements can be used in other embodiments. Also, the measurement of the angular rate $\Omega_y$ can be performed either with matched or nearly matched driving and sensing modes or with unmatched driving and sensing modes.

In some embodiments of the MEMS motion sensor the out-of-plane and in-plane driving frequencies each range from 1 to 100 kilohertz, and wherein each of the first, second and third sensing electrode assemblies are configured to sense the motion of the one or more proof masses associated therewith at an acceleration sensing frequency that is less than between about 30 percent and 50 percent of both the out-of-plane and in-plane driving frequencies.

Electrical Contacts and Insulated Conducting Pathways

Referring back to FIGS. 8 to 10, the MEMS motion sensor 10 further includes first and second sets of electrical contacts 42*a*, 42*b* provided on the top cap wafer 12. The first set of electrical contacts 42*a* are electrically connected to the top electrodes 13, and the second set of electrical contacts 42*b* are electrically connected to the bottom electrodes 15 by way of insulated conducting pathways 33. The insulating conducting pathways 33 extend upwardly from the bottom electrodes 15 successively through the bottom cap wafer 14, the frame structure 50 of the MEMS wafer 16 and the top cap wafer 12 until they reach the electrical contacts 42*b* of the second set. Of course, other electrical contacts may be provided on the top cap wafer, such as, for example, connecting feedthroughs extending from the bottom cap wafer to the top cap wafer. Likewise, other insulated conducting pathways may be provided to connect electrodes of the top cap wafer 12, and also possibly of one or more of the proof masses 17*a* to 17*e*.

Figure 15:
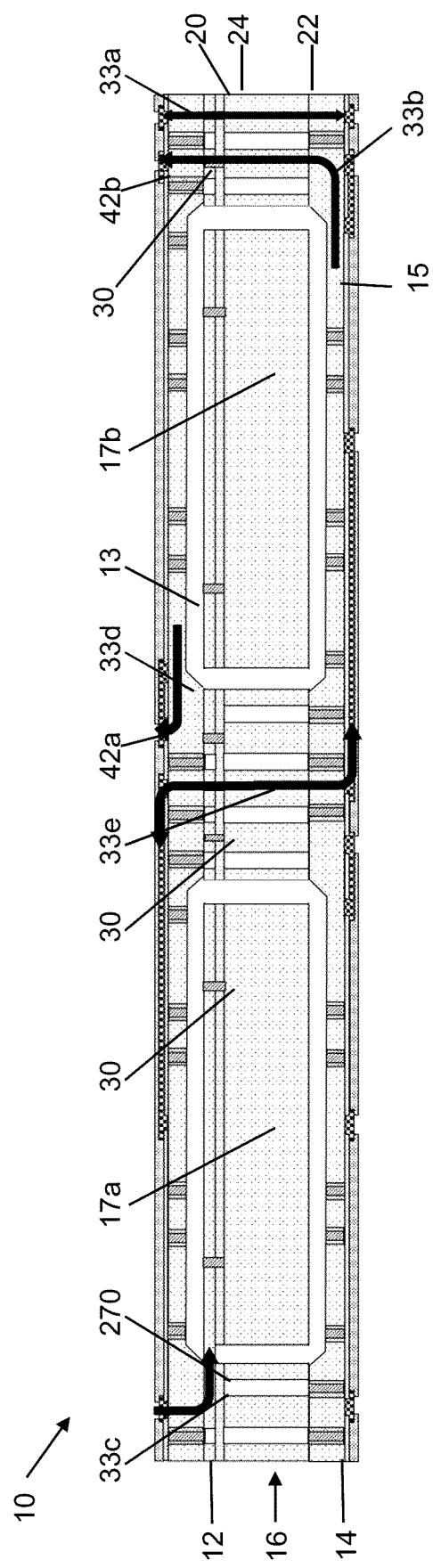
FIG. 15 is a schematic, cross-sectional view of the MEMS motion sensor of FIG. 8, taken along section line XV, depicting various insulated conducting pathways extending downwardly from electrical contacts on the top cap wafer.

Referring now to FIG. 15, there are illustrated different insulated conducting pathways 33*a* to 33*e* provided in the MEMS motions sensor 10 using 3DTCV architecture. A first insulated conducting pathway 33*a* electrically connects the outer or peripheral regions of the bottom cap wafer 14, the handle layer 22, the device layer 20 and the top cap wafer 12 to provide a case ground. A second insulating conducting pathway 33*b* feeds signals from bottom electrodes 15, upwardly through electrically isolated feedthroughs in the MEMS wafer 16 and top cap wafer 12, to bond pads 42*b* on top of the MEMS device 10. This pathway 33*b* uses conducting vias 30 between the handle layer 22 and the device layer 20, through the insulating layer 24. The conducting vias 30 can also be used to electrically connect the flexible springs 270 to the proof masses 17*a* to 17*e* so that they are not floating electrically.

A third insulated conducting pathway 33*c* brings signals to and from the device layer 20 while isolating it from the handle layer 22 in the periphery of the MEMS device 10 by eliminating conducting vias along that path. This pathway 33*c* may be useful, for example, for making electrical connections to the flexible springs 270 without shorting the springs 270 to the handle layer 22. A fourth insulated conducting pathway 33d to connect top electrodes 13 in the top cap wafer 12 to electrical contacts 42a (e.g., bond pads) on top of the MEMS device 10, while electrically isolating the top electrodes 13 from the rest of the MEMS device 10. A fifth insulated conducting pathway 33 routes signals from top cap electrodes 13 to bottom cap electrodes to drive electrodes in parallel as illustrated in FIG. 13, or to pass signals through the MEMS device 10, for example, from an IC on top through the MEMS to an underlying IC or printed circuit board (PCB).

Driving and Sensing Means

In addition, depending of the intended implementation of the MEMS motion sensor some of the top and bottom electrodes can be connectable to driving means, while other ones of the top and bottom electrodes can be connectable to sensing means.

Alternatively, the top and bottom electrodes can also be reconfigurably connectable to driving and sensing means, for switching between drive and sense modes. As used herein, the terms "driving means" and "sensing means" refer broadly to any electronic circuitry configured to deliver electrical signals to and receive electrical signals from the electrode assembly in order to drive and sense the motion of the proof mass of the MEMS motion sensor, respectively.

Other Exemplary Embodiments of a MEMS Motion Sensor

Figure 16:
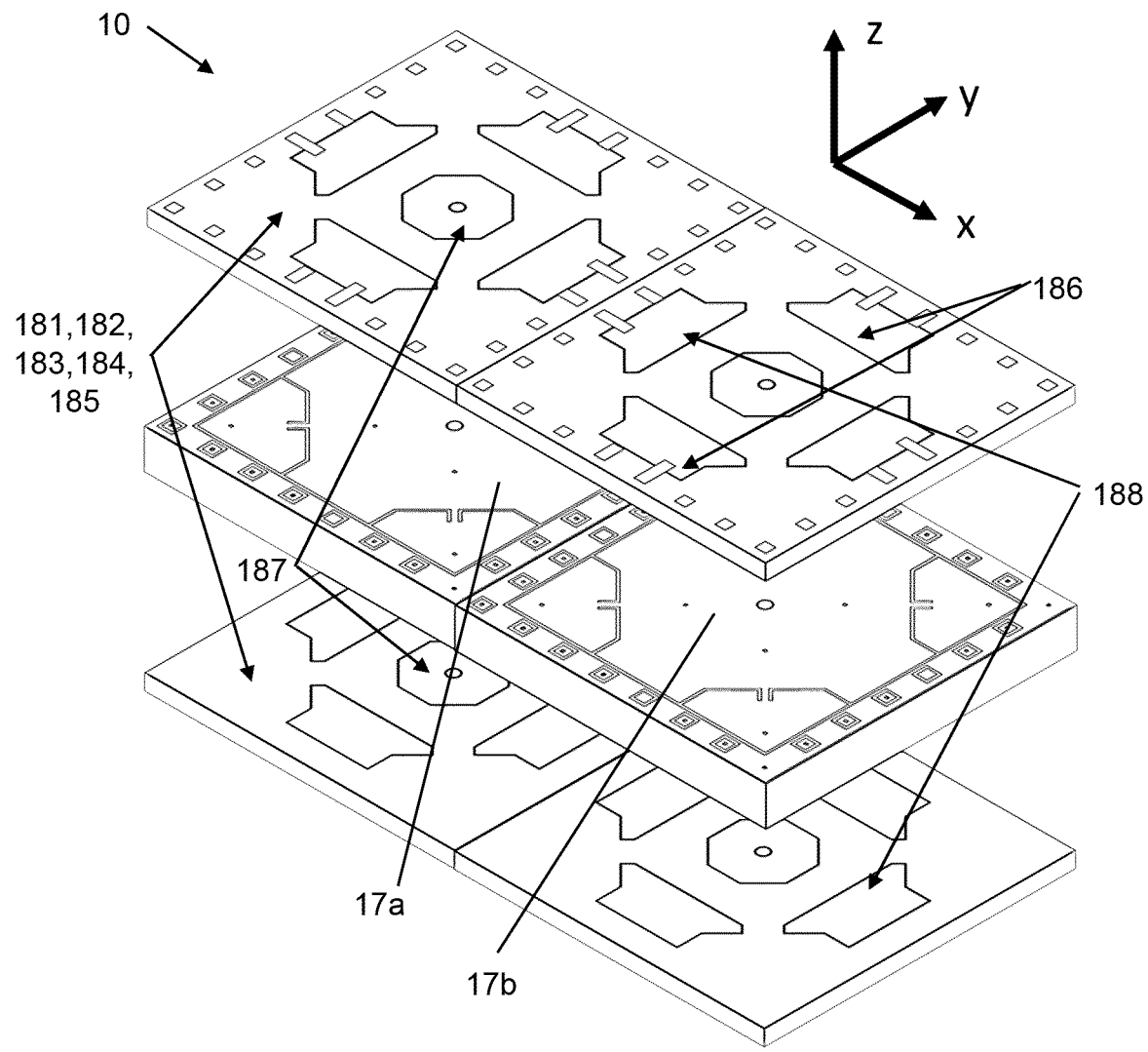
FIGS. 16A to 16C are schematic, partially exploded perspective views of three other exemplary embodiments of a multi-mass MEMS motion sensor including two, three and four proof masses, respectively.
Figure 16B:
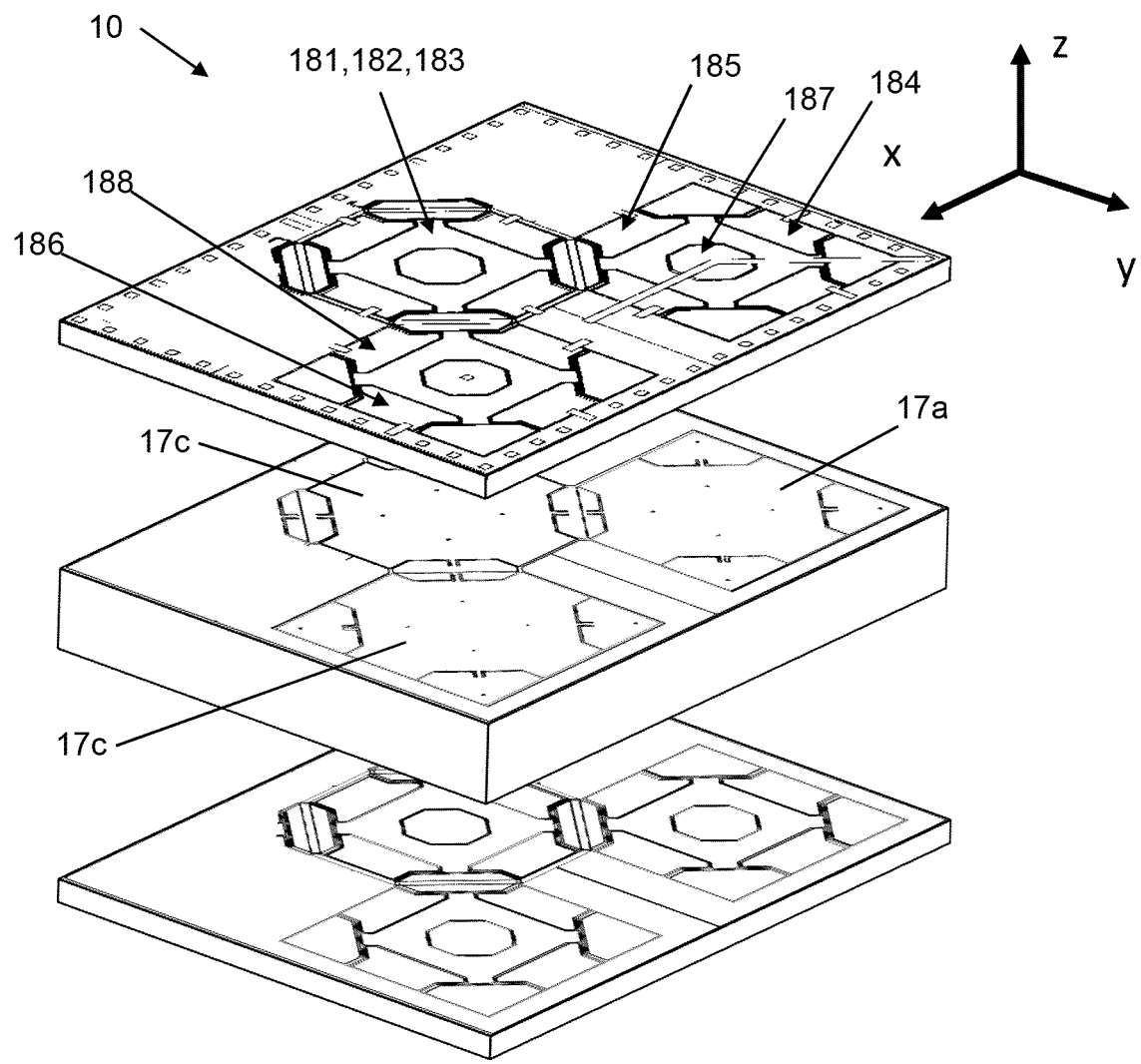
Figure 16C:
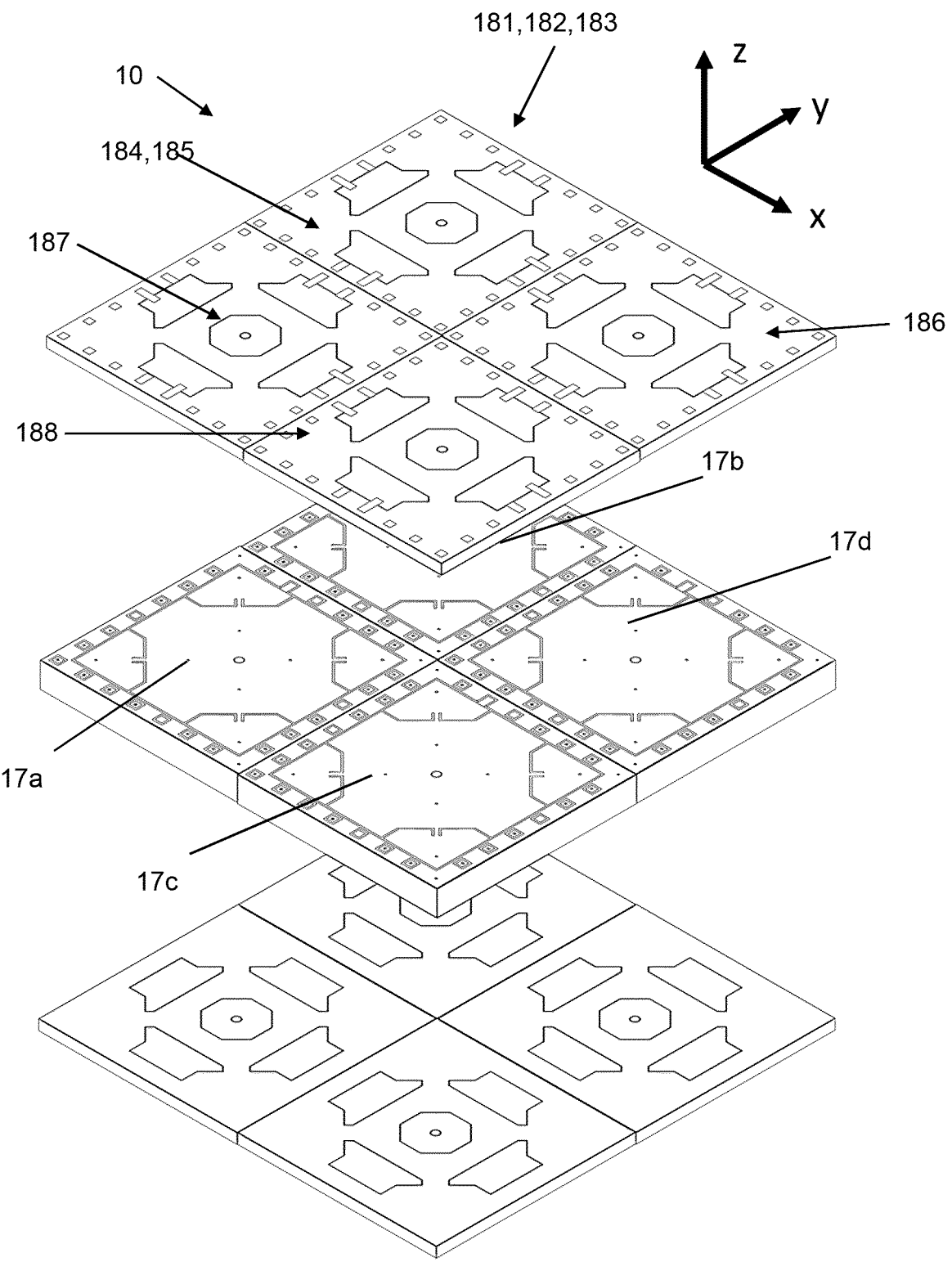

Referring now to FIGS. 16A to 16C, three other exemplary embodiments of a multi-mass MEMS motion sensor are illustrated. This embodiment shares many similarities with the embodiment described above and illustrated in FIGS. 8 to 15 in that they generally include a MEMS wafer provided with a frame structure, a plurality of proof masses and associated spring assemblies, top cap and bottom cap wafers sandwiching the MEMS wafer, top and bottom electrodes forming capacitors with and detecting the motions of the plurality of proof masses, and the top and bottom electrodes being together configured to detect motions of the plurality of proof masses. However, the number of proof masses and their functions in FIGS. 16A to 16C differ from those in FIGS. 8 to 15.

First, in FIG. 16A, the MEMS motion sensor 10 includes two proof masses 17a, 17b. In this embodiment, the first proof mass 17a is associated with the first driving electrode assembly 187 and the first, second, third, fourth and fifth sensing electrode assemblies 181 to 185, while the second proof mass 17b is associated with the second driving electrode assembly 188 and the sixth sensing electrode assembly 186. Accordingly, the first proof mass 17a is used for linear acceleration measurements along the x, y and z axes and in-plane angular rate measurements around the x and y axes, while the second proof mass 17b is used for out-of-plane angular rate measurements around the z axis.

Second, in FIG. 16B, the MEMS motion sensor 10 includes three proof masses 17a to 17c. In this embodiment, the first proof mass 17a is associated with the first driving electrode assembly 187 and the fourth and fifth sensing electrode assemblies 184, 185, the second proof mass 17b is associated with the second driving electrode assembly 188 and the sixth sensing electrode assembly 186, and the third proof mass 17c is associated with the first, second and third sensing electrode assemblies 181 to 183. Accordingly, the first proof mass 17a is used for in-plane angular rate measurements around the x and y axes, the second proof mass 17b is used for out-of-plane angular rate measurements around the z axis, and the third proof mass 17c is used for linear acceleration measurements along the x, y and z axes.

As in the embodiment described above with reference to FIGS. 8 to 15, the embodiment in FIG. 16B allows the in-plane angular rate measurements to be separated from the out-of-plane angular rate measurements, and isolates the three-axis linear acceleration measurements to a separate proof mass 17c to provide a different damping environment for the accelerometer. However, in contrast to the embodiment illustrated in FIGS. 8 to 15, the embodiment in FIG. 16B does not involve using pairs of proof masses driven in anti-phase for eliminating or reducing unwanted acceleration signals in angular rate measurements.

Third, in FIG. 16C, the MEMS motion sensor 10 includes four proof masses 17a to 17d. In this embodiment, the first and second proof masses 17a, 17b are associated with the first driving electrode assembly 187 and the fourth and fifth sensing electrode assemblies 184, 185, the third and fourth proof masses 17c, 17d are associated with the second driving electrode assembly 188 and the sixth sensing electrode assembly 186, and at least one of the four proof masses 17a to 17d is further associated with the first, second and third sensing electrode assemblies (e.g., the second proof mass 17b in FIG. 16C). Accordingly, the first and second proof masses 17a are used for in-plane angular rate measurements around the x and y axes, the third and fourth proof masses 17b are used for out-of-plane angular rate measurements around the z axis, and one of the four proof masses 17a to 17d is used for linear acceleration measurements along the x, y and z axes.

It is to be understood that while the embodiments illustrated in FIGS. 8 to 16C includes between two and five proof masses, it is also possible to provide, in other embodiments, a multiple-mass MEMS motion sensor including more than five proof masses, so as to increase accuracy and/or redundancy of the x, y or z acceleration and/or $\Omega_x$, $\Omega_y$, or $\Omega_z$ angular rate measurements.

Method of Measuring Acceleration and Angular Rate

In accordance with another aspect, there is provided a method of measuring acceleration and angular rate along mutually orthogonal first, second and third axes. The method for acceleration and angular measurement will be described in conjunction with FIGS. 8 to 15, which illustrate a multi-mass MEMS motion sensor according to an exemplary embodiment. It will be understood, however, that there is no intent to limit the method to this embodiment, for the method may admit to other equally effective embodiments. In particular, it will be understood that while the measurement method can, by way of example, be performed with the multi-mass MEMS motion sensor like that described above with reference to FIGS. 8 to 15, it may also be performed with any other suitable MEMS motion sensor provided with a plurality of proof masses.

Referring to FIGS. 8 to 10, the method first includes a step of providing a multi-mass MEMS motion sensor 10. The MEMS motion sensor 10 forms a multi-wafer stack that includes a MEMS wafer 16 having opposed top and bottom sides 161, 162, and top and bottom cap wafers 12, 14 respectively bonded to the top and bottom sides 161, 162 of the MEMS wafer 16. The top cap, bottom cap and MEMS wafer 12, 14, 16 are electrically conductive. The MEMS motion sensor 10 may also include top and bottom electrodes respectively provided in the top and bottom cap wafers 12, 14. The MEMS wafer 16 includes a frame structure 50, a plurality of proof masses 17a to 17e, and a plurality of spring assemblies 27a to 27e each suspending a corresponding one of the proof masses 17a to 17e from the frame structure 50 and enabling the corresponding one of the proof masses 17a to 17e to move along mutually orthogonal first, second and third axes z, x and y. The top cap wafer 12, bottom cap wafer 14 and frame structure 50 together define one or more cavities 31 such that each cavity 31 encloses one or more of the proof masses 17a to 17e, and each proof mass 17a to 17e is enclosed in one cavity 31. The top and bottom electrodes 13, 15 can form capacitors with and are together configured to detect motions of the proof masses 17a to 17e.

In FIGS. 8 to 10, the MEMS motion sensor 10 is provided with five proof masses 17a to 17e, where the first and second proof masses 17a, 17b are used for in-plane angular rate measurements around the x and y axes, the third and fourth proof masses 17c, 17d are used for out-of-plane angular rate measurements around the z axis, and the fifth proof mass 17e is used for linear acceleration measurements along the x, y and z axes. Of course, configurations with two, three or four proof masses could be employed in other embodiments, as well as configuration including more than five proof masses, so as to increase accuracy and/or redundancy of the acceleration and/or angular rate measurements.

The method next includes a step of vibrating one or more of the proof masses along the z axis at an out-of-plane drive frequency. For the MEMS motion sensor 10 of FIGS. 8 to 10, this step involves vibrating the first and second proof masses 17a, 17b at the out-of-plane drive frequency. Additionally, in some embodiment, the first and second proof masses 17a, 17b may be vibrated 180 degrees out-of-phase with each other. As mentioned above, by driving two proof masses driven 180 degrees out of phase with each other, the induced Coriolis accelerations of the two proof masses will also be 180 degrees out of phase, whereas any linear acceleration undergone by the two masses will be in-phase so that the signals from corresponding electrodes on the two masses are subtracted, any linear acceleration signals will cancel out.

The method also includes sensing Coriolis-induced, rocking motions along the y and x of the one or more second proof masses 17a, 17b driven along the z axis, in response to an angular rate about the x and y axes, respectively. For the MEMS motion sensor 10 of FIGS. 8 to 10, this step involves sensing Coriolis-induced, rocking motions along the y and x axes of the first and second proof masses 17a, 17b. This step can further involve forming first and third capacitors with the first proof mass 17a and second and fourth capacitors with the second proof mass 17a, 17b. A difference between a capacitance of the first capacitor and a capacitance of the second capacitor can be measured, this difference being indicative of the angular rate about the x axis. Likewise, a difference between a capacitance of the third capacitor and a capacitance of the fourth capacitor can also be measured, this difference being indicative of the angular rate of the first and second proof masses 17a, 17b about the y axis.

The method further includes vibrating one or more of the proof masses in a rocking motion along the y axis at an in-plane drive frequency. For the MEMS motion sensor 10 of FIGS. 8 to 10, this step involves vibrating the third and fourth proof masses 17c, 17d in a rocking motion along the y axis. Additionally, and as for the first and second proof masses 17a, 17b, in some embodiment, the third and fourth proof masses 17c, 17d may be vibrated 180 degrees out-of-phase with each other.

The method also includes sensing a Coriolis-induced, rocking motion along the x axis of the one or more proof masses driven along the y axis, in response to an angular rate about the z axis. For the MEMS motion sensor 10, this step involves sensing a Coriolis-induced, rocking motion along the x axis of the third and fourth proof masses 17c, 17d. This step can further involve forming fifth and sixth capacitors respectively with the third and fourth proof masses 17c, 17d. A difference between a capacitance of the fifth capacitor and a capacitance of the sixth capacitor can be measured, this difference being indicative of the angular rate about the z axis.

The method also includes sensing a translational motion along the z axis, a rotation about the x axis, and a rotation about the y axis of one of the proof masses, indicative of linear accelerations along the z, x and y axes, respectively. For the MEMS motion sensor 10 of FIGS. 8 to 10, the linear acceleration measurements involve only the fifth proof mass 17e. In some embodiment, the step of sensing the translational motion along the z axis, the rotation about the x axis, and the rotation about the y axis of the fifth proof mass 17e is carried at respective acceleration sensing frequencies that are each less than between 30 percent and 50 percent of both the out-of-plane and in-plane drive frequencies.

Method for Manufacturing a Multi-Mass MEMS Motion Sensor

In accordance with another aspect, there is provided a method of manufacturing a MEMS motion sensor including a plurality of proof masses. The method for manufacturing the MEMS device will be described with reference to the diagrams of FIGS. 17A to 17P, which schematically illustrate steps of an exemplary embodiment. It will be understood, however, that there is no intent to limit the method to this embodiment, for the method may admit to other equally effective embodiments. It will also be understood that the manufacturing method can, by way of example, be performed to fabricate multi-mass MEMS motion sensors like those described above with reference to FIGS. 8 to 15 and 16A to 16C, or any other suitable MEMS motion sensor provided with a plurality of proof masses.

Figure 17E:
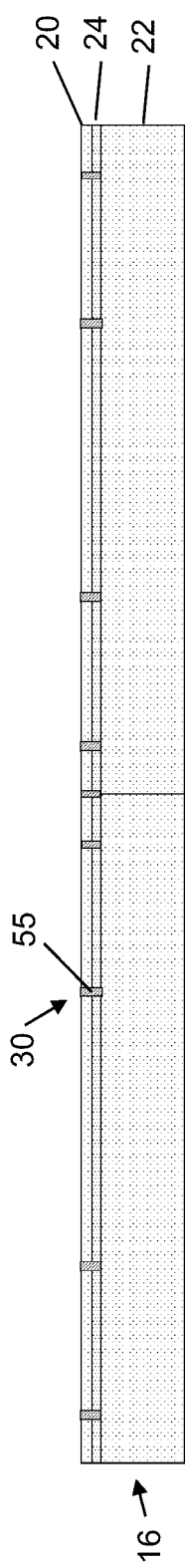
FIGS. 17A to 17P schematically illustrate steps of a method for manufacturing a multi-mass MEMS motion sensor, in accordance with an exemplary embodiment.
Figure 17F:
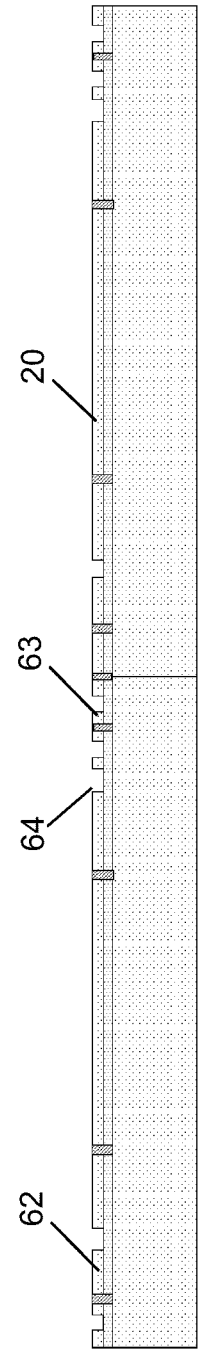
Figure 17G:
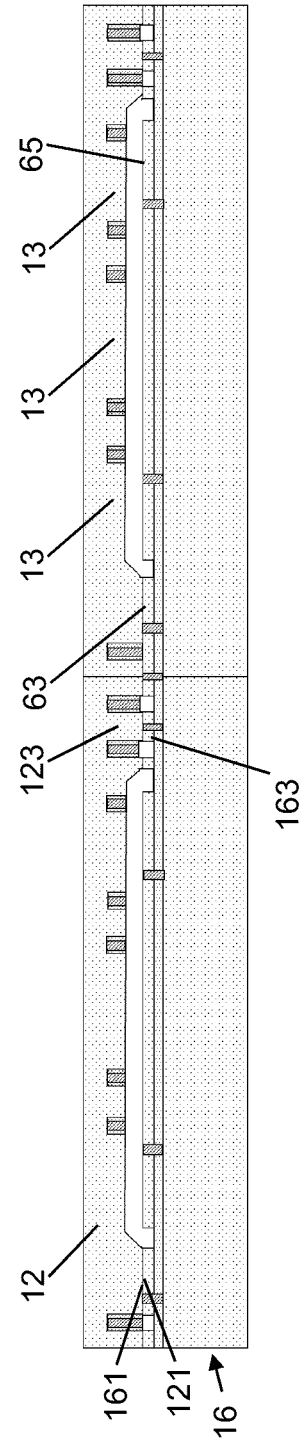
Figure 17H:
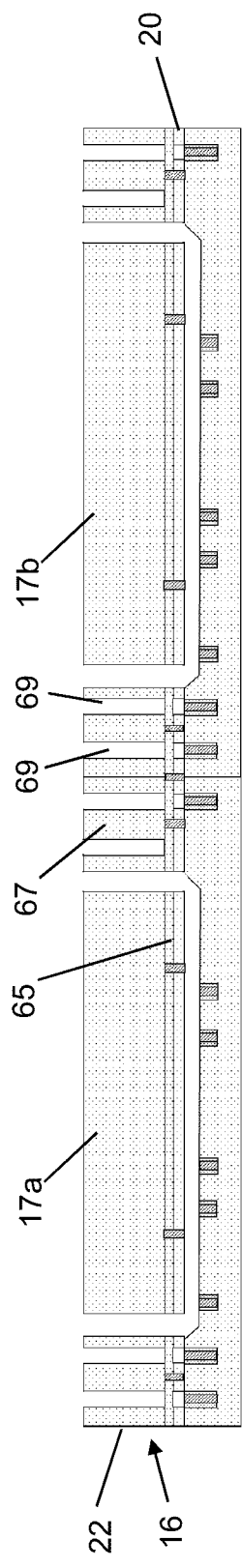
Figure 17I:
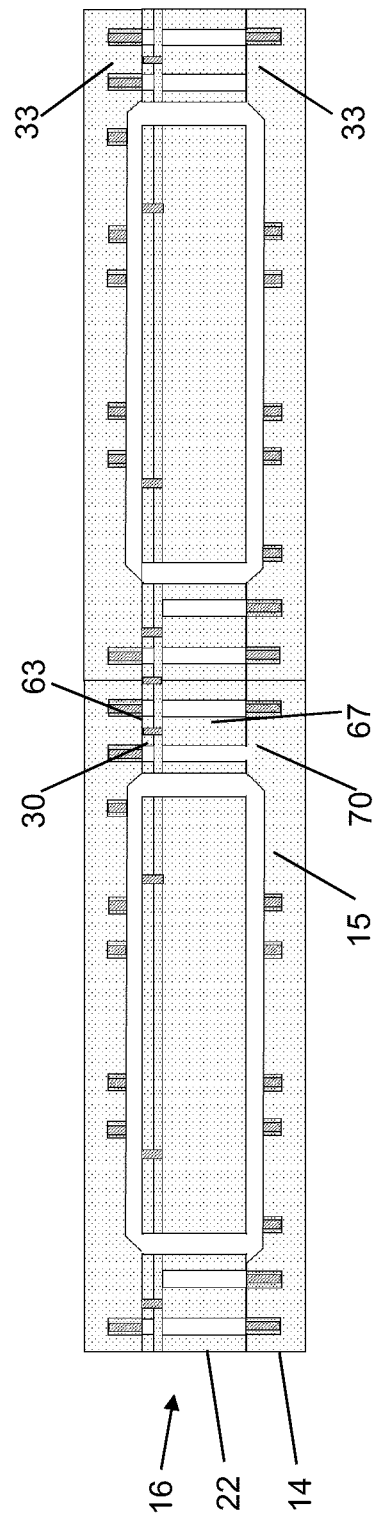
Figure 17J:
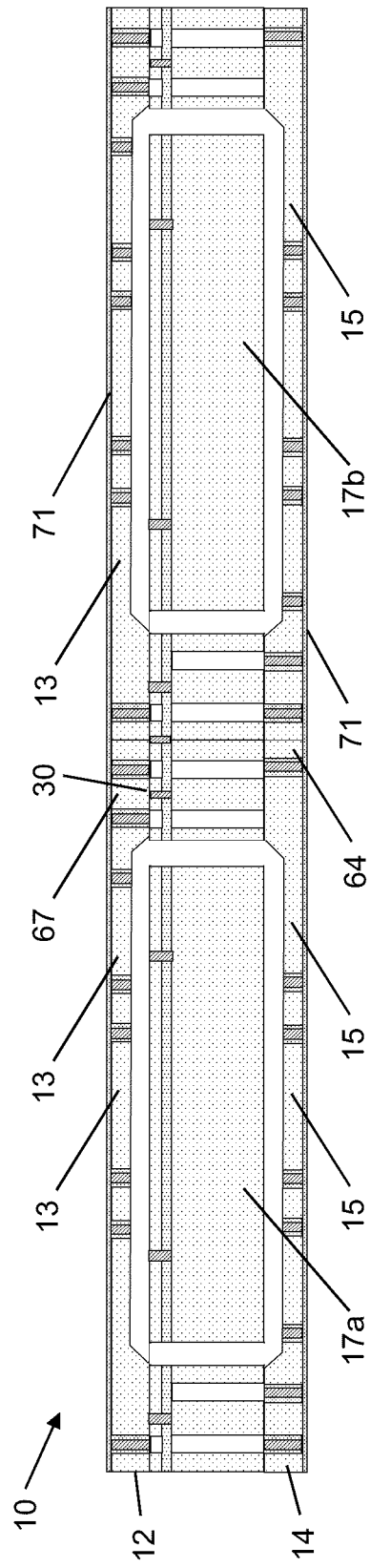
Figure 17K:
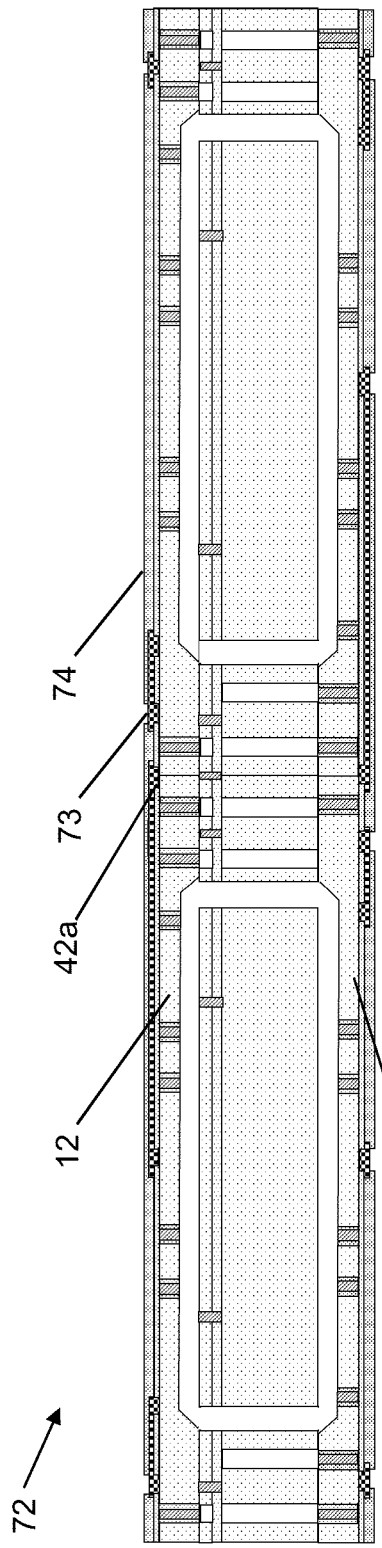
Figure 17L:
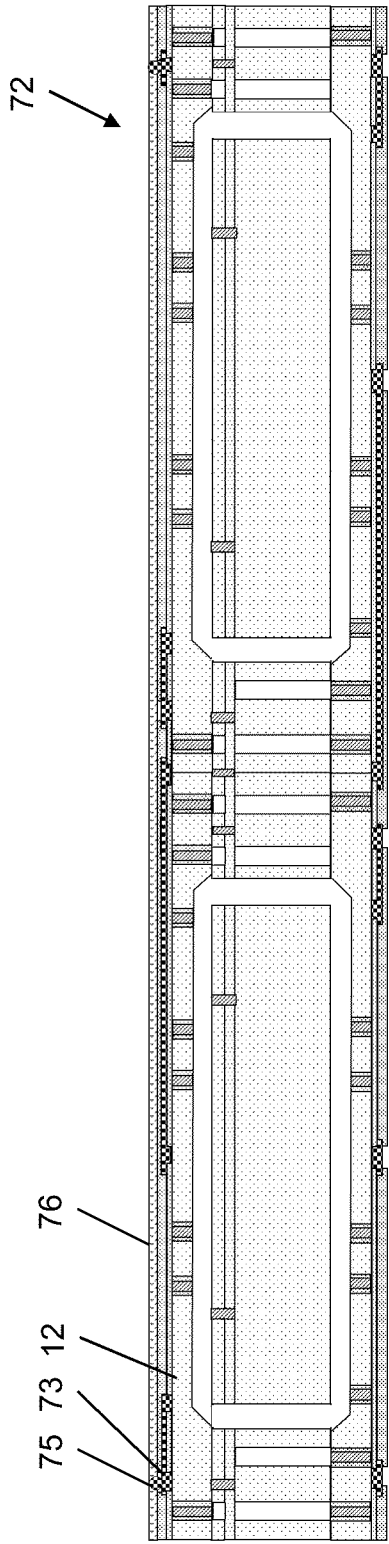
Figure 17M:
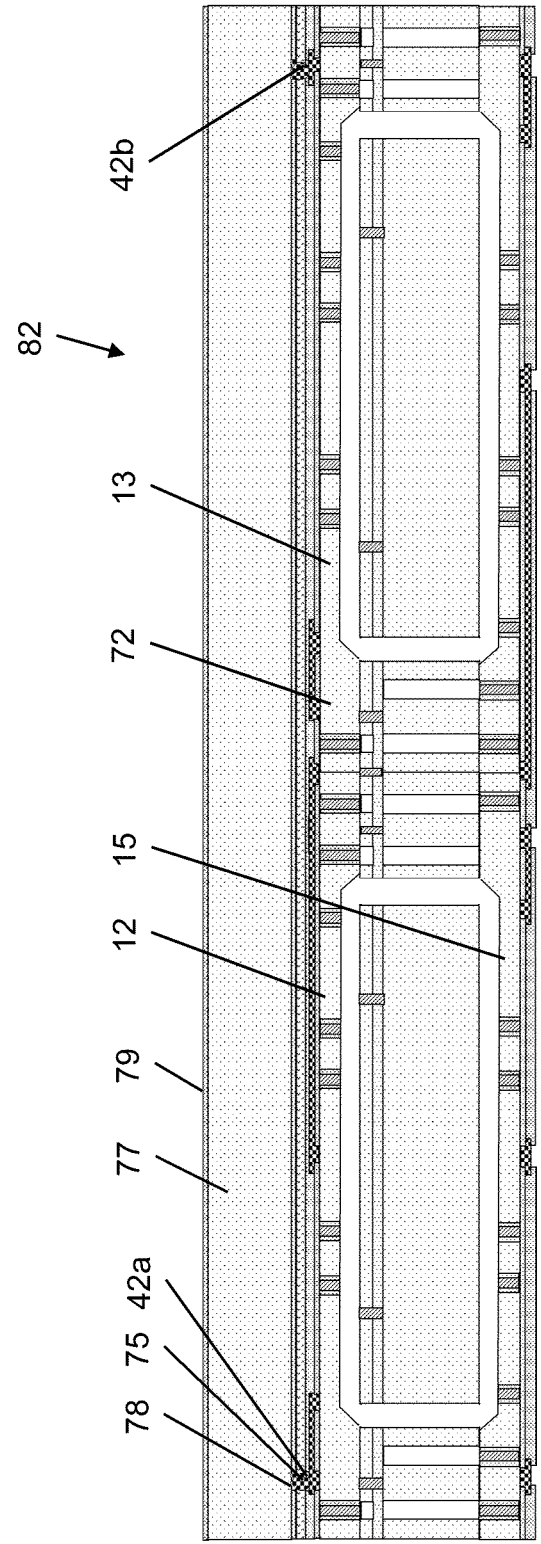
Figure 17N:
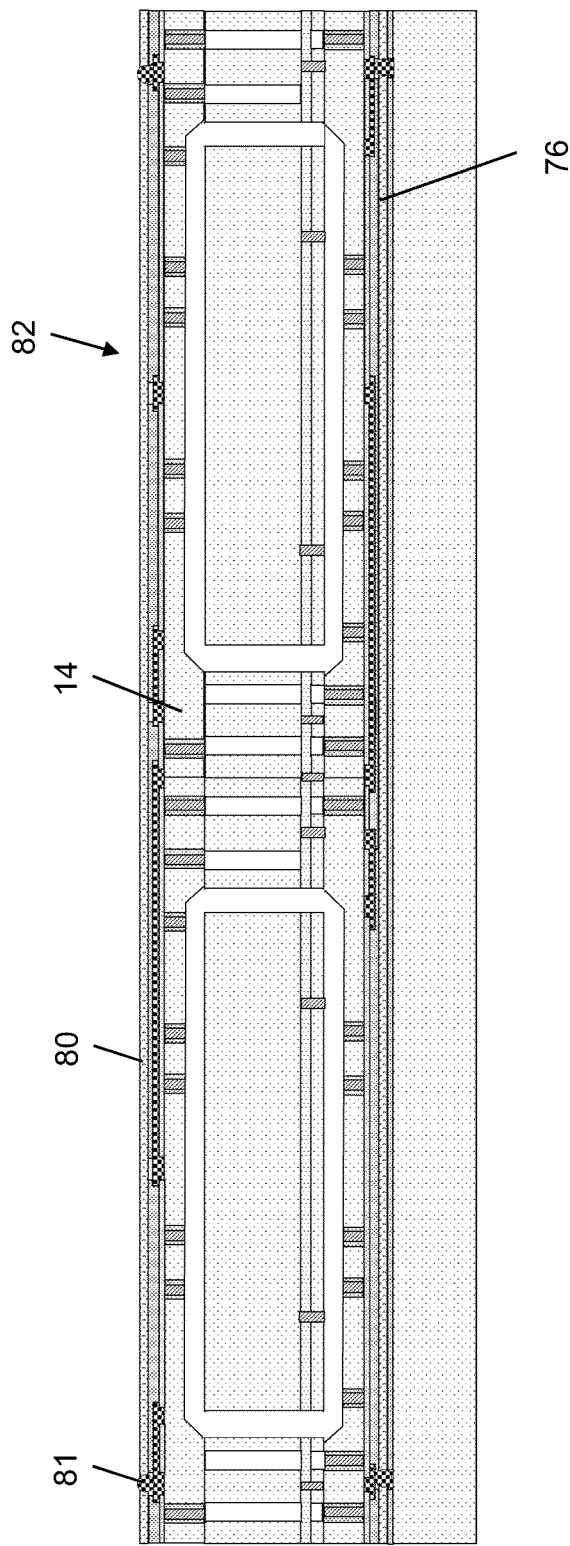
Figure 17O:
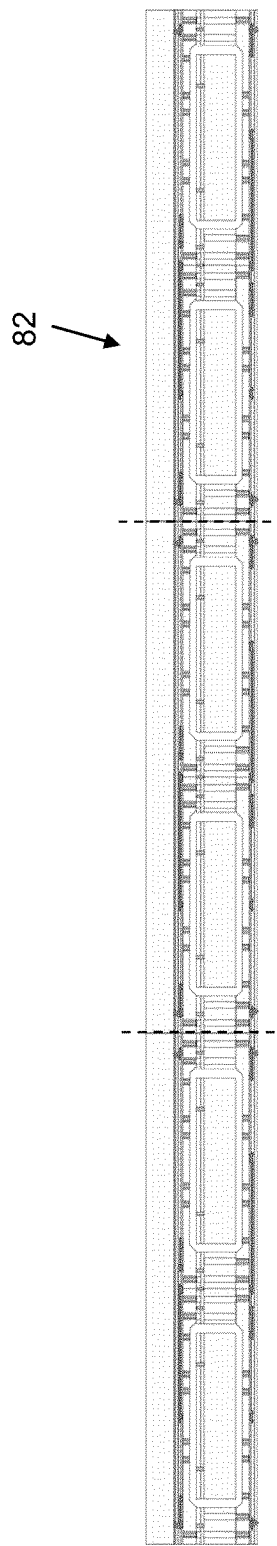
Figure 17P:
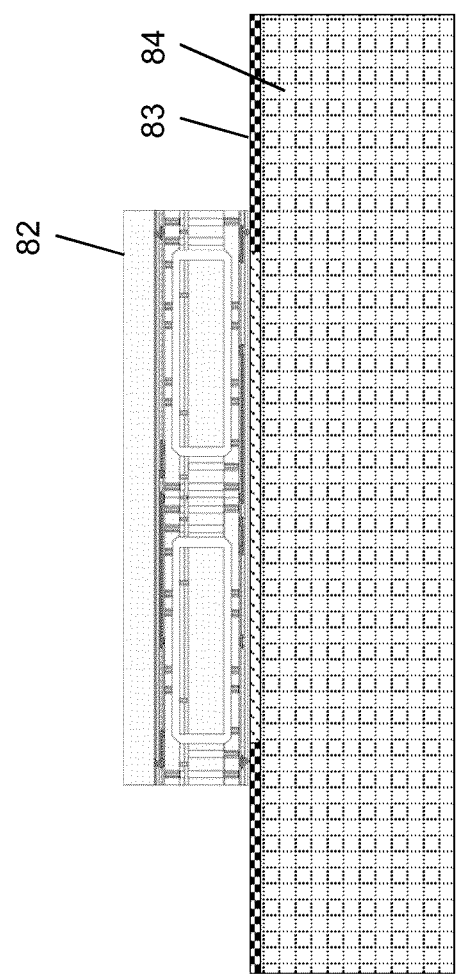

Referring to FIGS. 17A to 17P, there are schematically illustrated fabrication steps of an exemplary embodiment of the method for manufacturing a multi-mass MEMS motion sensor.

Referring to FIG. 17A, the manufacturing method includes a step of providing a top cap wafer 12. The top cap wafer 12 has opposed inner and outer sides 121, 122 and is made of an electrically conductive semiconductor material such as, for example, a silicon-based semiconductor. In some embodiments, the step of providing the top cap wafer 12 can include a step of forming recesses 51, or capacitor gaps, by removing top cap wafer material from a central region of the inner side 121 of the top cap wafer 12. The recesses 51 can be formed by any of several manufacturing methods including, but not limited to, photolithography and etch or patterned oxidation and etch. The recesses 51 may eventually form part of cavities whose role are to house proof masses once the top cap wafer 12 is bonded to a MEMS wafer 16, as described below. The manufacturing method also includes a step of forming top electrodes and insulated conducting cap wafer channels 123 from the inner side 121 into the top cap wafer 12, which can include patterning trenches 52 into the top cap wafer 12.

Turning to FIG. 17B, the trenches 52 may be filled with an insulating material 53. Alternatively, the trenches 52 may be lined with an insulating material 53 and then filled with a conducting material 55. For this purpose, trench and fill processes are available at different MEMS fabrication facilities, and the insulating and conducting materials may vary between them.

Referring to FIG. 17C, the steps of FIGS. 17A and 17B may be repeated on a bottom cap wafer 14 has opposed inner and outer sides 141, 142 to form a pattern of bottom cap electrodes, as well as recesses 51 or capacitor gaps, and insulated conducting cap wafer channels 143. As for the top cap wafer 12, the bottom cap wafer 14 is made of an electrically conductive semiconductor material such as, for example, a silicon-based semiconductor.

Referring now to FIG. 17D, the manufacturing method next includes providing a MEMS wafer 16 having opposed top and bottoms sides 161, 162. In FIG. 17D, the MEMS wafer is a SOI wafer including a device layer 20, a handle layer 22, and an insulating layer 24 (e.g., buried oxide) sandwiched between the device layer 20 and the handle layer 22. Conducting vias 30 are formed between the device layer 20 and the handle layer 22 through the insulating layer 24. The conducting vias 30 are patterned at desired spots on the device layer 20 and etched through the device layer 20 and insulating layer 24 to or slightly into the handle layer 22. In FIG. 17E, the conducting vias 30 may then be filled with a conducting material 55 which can be doped polycrystalline silicon (polysilicon), a metal, or another suitable conducting material. In this way an electrical path is formed vertically between the device layer 20 and the handle layers 22 of the MEMS wafer 16.

Referring to FIG. 17F, MEMS patterns including leads 62 and feedthroughs 63 may be patterned, delimited by trenches 64 in the device layer 20.

Referring to FIG. 17G, the manufacturing method includes a step of aligning and bonding the top side 161 of the MEMS wafer 16 to the inner side 121 of the top cap wafer 12. This step can involve aligning the feedthroughs 63 in the device layer 20 to corresponding pads on the top cap wafer 12, aligning the electrodes 13 in the top cap wafer 12 to corresponding electrodes 65 on the MEMS wafer 16, aligning the insulated conducting cap wafer channels 123 in the top cap wafer 12 with corresponding portions of the insulated conducting MEMS channels 163. Advantageously, the wafer bonding process used can provide a conductive bond such as, for example, fusion bonding, gold thermocompression bonding, or gold-silicon eutectic bonding.

Referring to FIG. 17H, the manufacturing method next includes patterning the handle layer 22 of the MEMS wafer 16 with MEMS structures such as a plurality of proof masses 17a, 17b and feedthroughs 67, which are aligned with similar structures on the device layer 20, such as the electrodes 65 and flexible springs (not shown). Trenches 69 can be etched around each feedthrough 67 to isolate the feedthrough 67 from the rest of the handle layer 22. In some embodiments, if the feedthrough 67 is attached to a SOI via on the device layer 20, then the feedthrough 67 becomes an isolated electrical feedthrough. However, if the feedthrough 67 is not attached to a SOI via, the feedthrough 67 then acts merely as a mechanical support.

Referring to FIG. 17I, the bottom cap wafer 14 may next be bonded to the backside of the handle layer 22. Again, a wafer bonding method such as fusion bonding, gold thermocompression bonding, or gold-silicon eutectic bonding can be used to provide electrical contacts between the feedthroughs 67 in the MEMS wafer 16 and pads 70 in the bottom cap wafer 14, which are connected electrically to the bottom electrodes 15. In this manner, a conductive path can be provided from the bottom electrodes 15 through the bottom cap pads 70, handle feedthroughs 67, SOI vias 30, and SOI device layer pads 63 to the top cap pads.

Referring to FIG. 17J, at this stage of the manufacturing method, the MEMS motion sensor 10 is hermetically sealed between the top and bottom cap wafers 12, 14 and the proof masses 17a, 17b are aligned with the top cap and bottom cap electrodes 13, 15. Because the insulating conducting pathways 33 do not yet fully penetrate the caps, the electrodes on each cap are shorted together through the remaining silicon (see, e.g., FIG. 17I). Both cap wafers 12, 14 may then be thinned, for example by grinding and polishing, to expose the insulating conducting channels 64. The electrodes are thus electrically isolated except for connections to top cap pads through the feedthroughs 67 and conducting vias 30. Both outer surfaces of the top and bottom cap wafers 12, 14 can be passivated with an insulating oxide layer 71 for protection purposes.

Referring to FIG. 17K, contacts 42a can be opened over the pads in the top cap wafer 12, bond pad metal 73 can be deposited and patterned, and passivating oxide 74 can be applied and patterned to expose the bond pads. These or similar steps may be performed on the bottom cap wafer 14. In this way, electrical connections from the top, sides, and/or bottom of the MEMS motion sensor can become accessible from the top or bottom for wire bonding, flip chip bonding, or wafer bonding. After completion of the step depicted in FIG. 17K, the wafer level fabrication of a hermetically sealed MEMS motion sensor wafer 72 is obtained.

At this point, if desired, the MEMS motion sensor wafer 72 can be diced into individual MEMS chips. Alternatively, the 3DTCV architecture described herein may allow a wafer containing ICs for sensing and data processing to be bonded directly to the MEMS motion sensor wafer 72. The wafer-level integration of the 3D system (3DS) can involve bonding of an application-specific IC (ASIC) wafer designed with the appropriate system electronics for the application and with a physical bond pad layout commensurate with the MEMS motion sensor wafer 72.

Referring to FIG. 17L, bump-bonds 75 can be applied to one side of the MEMS motion sensor wafer 72. Numerous approaches and materials used in the semiconductor industry can provide wafer bumps. In one embodiment, a thick photoresist underfill 76 is applied to one side (e.g., the top cap wafer 12 in FIG. 17L) of the MEMS motion sensor wafer 72 and patterned to produce an electroplating mask with openings over the bond pad metal 73. Thick solder can be electroplated into the openings. The solder can be left as a column or reflowed into balls, depending upon the bonding method. The photoresist can be stripped leaving the balls isolated, or can be left in place as an underfill to protect the wafer surface. If the photoresist is removed, a separate polymeric underfill layer 76 can be coated and patterned around the solder balls. The purpose of the underfill is to protect the wafer or chip surface and to mitigate bump shearing due to the thermal stress of heating during bonding.

Referring to FIG. 17M, an ASIC wafer 77 can then be flipped and aligned to the MEMS motion sensor wafer 72 (e.g., to the top cap wafer 12 in FIG. 17M) such that ASIC bond pads 78 are aligned to the top cap solder bumps 75. The ASIC wafer has circuitry electrically connected to the MEMS motion sensor wafer 72, and in particular, to the first and second sets of electrical contacts (42a, 42b) described above for routing signals to and from the top and bottom electrodes 13, 15. The ASIC wafer may be bonded to the MEMS motion sensor wafer 72 using temperature and pressure to produce a 3DS wafer 82. At this point the ASIC wafer 77 (e.g., a CMOS wafer) can be thinned, if desired, and passivated with a PECVD oxide 79.

Referring to FIG. 17N, an underfill 80 and bottom cap solder bumps 81 may next be applied to the bottom cap 14 of the 3DS wafer 82. The process is similar to that illustrated in FIG. 17L, except that in the case of solder bumps, a lower eutectic point solder than that used for the top bump-bonds is generally used to avoid releasing the top solder joints. The top of the ASIC wafer 77 may be protected with an ASIC oxide passivation 79 layer and the MEMS/ASIC interface may be protected by the underfill 76. The bonded 3DS wafer 82 can finally be diced into individual 3DS components.

Referring to FIG. 17O, in some embodiments, the 3DS wafer 82 can be diced into self-packaged MEMS IMUs without requiring additional wire bonding or external packaging to.

Referring to FIG. 17P, the MEMS IMU 82 diced into self-packaged MEMS IMUs can then be directly solder bumped to leads 83 on a PCB 84.

Of course, numerous modifications could be made to the embodiments described above without departing from the scope of the present invention.

The invention claimed is:

1. A micro-electro-mechanical system (MEMS) motion sensor comprising:
    a silicon-on-insulator (SOI) MEMS wafer having opposed top and bottom sides and comprising a frame structure, a plurality of proof masses, and a plurality of spring assemblies each suspending a corresponding one of the proof masses from the frame structure and enabling the corresponding one of the proof masses to move along mutually orthogonal first, second and third axes, wherein at least one of the plurality of proof masses has an SOI structure including a device layer, a handle layer, and an insulating layer between the device layer and the handle layer;
    top and bottom cap wafers respectively bonded to the top side of the SOI MEMS wafer at the device layer and to the bottom side of the SOI MEMS wafer at the handle layer, the top cap, bottom cap and MEMS wafers being electrically conductive, the top cap wafer, bottom cap wafer and frame structure together defining one or more cavities each enclosing one or more of the plurality of proof masses, each proof mass being enclosed in one of the one or more cavities;
    top and bottom electrodes respectively provided in the top and bottom cap wafers and forming capacitors with the plurality of proof masses, the top and bottom electrodes being together configured to detect motions of the plurality of proof masses; and
    first and second sets of electrical contacts provided on the top cap wafer, the first set of electrical contacts being electrically connected to the top electrodes, and the second set of electrical contacts being electrically connected to the bottom electrodes by way of a plurality of insulated conducting pathways extending successively through the bottom cap wafer, the frame structure of the MEMS wafer, and the top cap wafer, wherein a first plurality of said plurality of insulated conducting pathways electrically connect a plurality of said electrical contacts to corresponding electrodes coupled to a first proof mass of said plurality of proof masses and a second plurality of said plurality of insulated conducting pathways connect a further plurality of said electrical contacts to corresponding electrodes coupled to a second proof mass of said plurality of proof masses.

2. The MEMS motion sensor according to claim 1, wherein the MEMS motion sensor is configured as a six-degree-of-freedom motion sensor enabling three-axis linear acceleration and angular rate measurements.

3. The MEMS motion sensor according to claim 2, wherein the top and bottom electrodes form a plurality of electrode assemblies each electrode assembly including at least one pair of the top and/or bottom electrodes, the plurality of electrode assemblies comprising:
    a first sensing electrode assembly associated with one or more of the plurality of proof masses and configured to detect a translational motion of the one or more proof masses associated with the first sensing electrode assembly along the first axis, the translational motion being indicative of a linear acceleration along the first axis;
    a second sensing electrode assembly associated with one or more of the plurality of proof masses and configured to detect a rotation of the one or more proof masses associated with the second sensing electrode assembly about the third axis, the rotation about the third axis being indicative of a linear acceleration along the second axis;
    a third sensing electrode assembly associated with one or more of the plurality of proof masses and configured to detect a rotation of the one or more proof masses associated with the third sensing electrode assembly about the second axis, the rotation about the second axis being indicative of a linear acceleration along the third axis;
    a first driving electrode assembly associated with and configured to drive a motion of one or more associated ones of the plurality of proof masses along the first axis at an out-of-plane drive frequency;
    a fourth sensing electrode assembly associated with the one or more proof masses associated with the first driving electrode assembly and configured to sense a Coriolis-induced, rocking motion of the one or more proof masses associated with the first driving electrode assembly along the third axis, the Coriolis-induced, rocking motion along the third axis being indicative of an angular rate about the second axis;
    a fifth sensing electrode assembly associated with the one or more proof masses associated with the first driving electrode assembly and configured to sense a Coriolis-induced, rocking motion of the one or more proof masses associated with the first driving electrode assembly along the second axis, the Coriolis-induced, rocking motion along the second axis being indicative of an angular rate about the third axis;
    a second driving electrode assembly associated with and configured to drive a rocking motion of one or more associated ones of the proof masses along one of the second and third axes at an in-plane drive frequency; and
    a sixth sensing electrode assembly associated with the one or more proof masses associated with the second driving electrode assembly and configured to sense a Coriolis-induced, rocking motion of the one or more proof masses associated with the second driving electrode assembly along the other one of the second and third axes, the Coriolis-induced, rocking motion along the other one of the second and third axes being indicative of an angular rate about the first axis.

4. The MEMS motion sensor according to claim 3, wherein the out-of-plane and in-plane drive frequencies each range from 1 to 100 kilohertz, and wherein each of the first, second and third sensing electrode assemblies are configured to sense the motion of the one or more proof masses associated therewith at an acceleration sensing frequency that is between about 30 percent and 50 percent of both the out-of-plane and in-plane drive frequencies.

5. The MEMS motion sensor according to claim 3, wherein the cavity of each mass associated with at least one of the first and second driving electrode assemblies is a hermetically sealed vacuum cavity.

6. The MEMS motion sensor according to claim 3, wherein the plurality of proof masses comprises five proof masses configured as follows:
   first and second proof masses both associated with the first driving electrode assembly and the fourth and fifth sensing electrode assemblies; and
   third and fourth proof masses both associated with the second driving electrode assembly and the sixth sensing electrode assembly; and
   a fifth proof mass associated with the first, second and third sensing electrode assemblies.

7. The MEMS motion sensor according to claim 6, wherein the five proof masses are arranged in a common plane encompassing the second and third axes, the fifth proof mass being located centrally and surrounded by the first, second, third and fourth proof masses.

8. The MEMS motion sensor according to claim 6, wherein the first driving electrode assembly is configured to drive the first proof mass 180 degrees out-of-phase relative to the second proof mass, and wherein the second driving electrode assembly is configured to drive the third proof mass 180 degrees out-of-phase relative to the fourth proof mass.

9. The MEMS motion sensor according to claim 6, wherein:
   the fourth sensing electrode assembly is configured to form first and second capacitors with the first and second proof masses, respectively, and to measure a difference between a capacitance of the first capacitor and a capacitance of the second capacitor, said difference being indicative of an angular rate of the first and second proof masses about the second axis;
   the fifth sensing electrode assembly is configured to form third and fourth capacitors with the first and second proof masses, respectively, and to measure a difference between a capacitance of the third capacitor and a capacitance of the fourth capacitor, said difference being indicative of an angular rate of the first and second proof masses about the third axis; and
   the sixth sensing electrode assembly is configured to form fifth and sixth capacitors with the third and fourth proof masses, respectively, and to measure a difference between a capacitance of the fifth capacitor and a capacitance of the sixth capacitor, said difference being indicative of an angular rate of the third and fourth proof masses about the first axis.

10. The MEMS motion sensor according to claim 6, wherein:
   the first driving electrode assembly comprises:
      a pair of top driving electrodes, one of which being located above a central region of the first proof mass and the other being located above a central region of the second proof mass; and
      a pair of bottom driving electrodes, one of which being located below the central region of the first proof mass and the other being located below the central region of the second proof mass;
   the fourth sensing electrode assembly comprises:
      a first pair of top sensing electrodes disposed along a line parallel to the third axis, on opposite sides of the top driving electrode located above the central region of the first proof mass;
      a second pair of top sensing electrodes disposed along a line parallel to the third axis, on opposite sides of the top driving electrode located above the central region of the second proof mass;
      a first pair of bottom sensing electrodes disposed along a line parallel to the third axis, on opposite sides of the bottom driving electrode located below the central region of the first proof mass; and
      a second pair of bottom sensing electrodes disposed along a line parallel to the third axis, on opposite sides of the bottom driving electrode located below the central region of the second proof mass; and
   the fifth sensing electrode assembly comprises:
      a first pair of top sensing electrodes disposed along a line parallel to the second axis, on opposite sides of the top driving electrode located above the central region of the first proof mass;
      a second pair of top sensing electrodes, disposed along a line parallel to the second axis, on opposite sides of the top driving electrode located above the central region of the second proof mass;
      a first pair of bottom sensing electrodes disposed along a line parallel to the second axis, on opposite sides of the bottom driving electrode located below the central region of the first proof mass; and
      a second pair of bottom sensing electrodes disposed along a line parallel to the second axis, on opposite sides of the bottom driving electrode located below the central region of the second proof mass.

11. The MEMS motion sensor according to claim 6, wherein:
   the second driving electrode assembly comprises:
      a first pair of top driving electrodes disposed along a line parallel to the one of the second and third axes, above and laterally offset with respect to a central region of the third proof mass;
      a second pair of top driving electrodes disposed along a line parallel to the one of the second and third axes, above and laterally offset with respect to a central region of the fourth proof mass;
      a first pair of bottom driving electrodes disposed along a line parallel to the one of the second and third axes, below and laterally offset with respect to the central region of the third proof mass; and
      a second pair of bottom driving electrodes disposed along a line parallel to the one of the second and third axes, below and laterally offset with respect to the central region of the fourth proof mass; and
   the sixth sensing electrode assembly comprises:
      a first pair of top sensing electrodes disposed along a line parallel to the other one of the second and third axes, above and laterally offset with respect to central region of the third proof mass;
      a second pair of top sensing electrodes disposed along a line parallel to the other one of the second and third axes, above and offset with respect to central region of the fourth proof mass;
      a first pair of bottom sensing electrodes disposed along a line parallel to the other one of the second and third axes, below and laterally offset with respect to central region of the third proof mass; and
      a second pair of bottom sensing electrodes disposed along a line parallel to the other one of the second and third axes, below and offset with respect to central region of the fourth proof mass.

12. The MEMS motion sensor according to claim 1, wherein each proof mass and corresponding spring assembly form a resonant structure configured to have a resonance condition between a driving mode and a sensing mode for angular rate measurements.

13. The MEMS motion sensor according to claim 1, wherein the top cap wafer and the bottom cap wafer are each made of a silicon-based semiconductor.

14. The MEMS motion sensor according to claim 13, wherein each proof mass includes a device layer, a handle layer under and spaced from the device layer, and an insulating layer sandwiched between the device and handle layers, wherein at least one proof mass device layer is electrically connected to the handle layer with a shunt.

15. The MEMS motion sensor according to claim 1, wherein:
the proof masses each have a thickness and a polygonal cross-section respectively along and perpendicular to the first axis; and
the spring assemblies each comprise flexible springs mechanically connecting the corresponding proof mass to the frame structure, the flexible springs each having a thickness along the first axis that is significantly less than the thickness of the corresponding proof mass.

16. The MEMS motion sensor according to claim 15, wherein the thickness of each of the plurality of proof masses ranges from 10 to 1000 micrometers.

17. A MEMS motion sensor system architecture comprising:
a MEMS motion sensor according to claim 1; and
an integrated circuit (IC) wafer bonded to the top cap wafer of the MEMS motion sensor, the IC wafer having circuitry electrically connected to the MEMS motion sensor.

18. The MEMS motion sensor system architecture according to claim 17, wherein the circuitry of the IC wafer is electrically connected to the first and second sets of electrical contacts of the MEMS motion sensor for routing signals to and from the top and bottom electrodes.

19. The MEMS motion sensor according to claim 1 wherein the top cap wafer is fusion bonded to the device layer of the SOI MEMS wafer and the bottom cap wafer is fusion bonded to the handle layer of the SOI MEMS wafer.

20. A micro-electro-mechanical system (MEMS) motion sensor comprising:
a silicon-on-insulator (SOI) MEMS wafer having opposed top and bottom sides and comprising a frame structure, a plurality of proof masses, and a plurality of spring assemblies each suspending a corresponding one of the proof masses from the frame structure and enabling the corresponding one of the proof masses to move along mutually orthogonal first, second and third axes, wherein at least one of the plurality of proof masses has an SOI structure including a device layer, a handle layer, and an insulating layer between the device layer and the handle layer;
top and bottom cap wafers respectively fusion bonded to the top side of the SOI MEMS wafer at the device layer and to the bottom side of the SOI MEMS wafer at the handle layer, the top cap, bottom cap and MEMS wafers being electrically conductive, the top cap wafer, bottom cap wafer and frame structure together defining one or more cavities each enclosing one or more of the plurality of proof masses, each proof mass being enclosed in one of the one or more cavities;
a plurality of electrodes forming capacitors with the plurality of proof masses, at least one of the plurality of electrodes being configured to detect motion of one or more of the plurality of proof masses; and
first and second sets of electrical contacts on at least one of the top cap wafer and the bottom cap wafer, at least one of the first set of electrical contacts being electrically connected to at least one electrode coupled to a first proof mass of said plurality of proof masses and at least one of the second set of electrical contacts to at least one further electrode coupled to a second proof mass of said plurality of proof masses.

21. The MEMS motion sensor according to claim 20, wherein the MEMS motion sensor is configured as a six-degree-of-freedom motion sensor providing three-axis linear acceleration and angular rate measurements.

22. The MEMS motion sensor according to claim 20, wherein at least one electrode in the plurality of electrodes comprises a drive electrode to actuate at least one of out-of-plane and in-plane drive frequencies that each range from 1 to 100 kilohertz, and wherein each of first, second and third sensing electrodes in the plurality of electrodes are configured to sense the motion of the one or more proof masses associated therewith at an acceleration sensing frequency that is between about 30 percent and 50 percent of both the out-of-plane and in-plane drive frequencies.

23. The MEMS motion sensor according to claim 22, wherein the cavity of each mass associated with at least one of the drive electrode and a further drive electrode in the plurality of electrodes is a hermetically sealed vacuum cavity.

24. The MEMS motion sensor according to claim 23, wherein the first drive electrode is configured to drive the first proof mass 180 degrees out-of-phase relative to the second proof mass, and wherein the further drive electrode is configured to drive a third proof mass 180 degrees out-of-phase relative to a fourth proof mass.

* * * * *